United States Patent
Takahashi

(10) Patent No.: US 9,543,909 B2
(45) Date of Patent: Jan. 10, 2017

(54) AMPLIFIER, DRIVING METHOD FOR AMPLIFIER, AND ELECTRONIC CIRCUIT SYSTEM

(71) Applicant: Sony Corporation, Tokyo (JP)

(72) Inventor: Katsuaki Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 16 days.

(21) Appl. No.: 14/633,375

(22) Filed: Feb. 27, 2015

(65) Prior Publication Data
US 2015/0263691 A1 Sep. 17, 2015

(30) Foreign Application Priority Data
Mar. 14, 2014 (JP) .................................. 2014-051893

(51) Int. Cl.
| | |
|---|---|
| *H03F 1/22* | (2006.01) |
| *H03F 3/19* | (2006.01) |
| *H03F 1/02* | (2006.01) |
| *H03F 3/21* | (2006.01) |
| *H03F 3/45* | (2006.01) |
| *H03F 3/72* | (2006.01) |

(Continued)

(52) U.S. Cl.
CPC .............. *H03F 3/19* (2013.01); *H03F 1/0277* (2013.01); *H03F 1/223* (2013.01); *H03F 3/211* (2013.01); *H03F 3/45183* (2013.01); *H03F 3/72* (2013.01); *H03G 1/0029* (2013.01); *H03G 1/0088* (2013.01); *H03G 3/3063* (2013.01); *H03G 3/3068* (2013.01); *H03F 2200/411* (2013.01); *H03F 2200/451* (2013.01); *H03F 2200/456* (2013.01); *H03F 2203/45024* (2013.01)

(58) Field of Classification Search
CPC ........................................................ H03F 1/22
USPC ........................................ 330/311, 310, 278
See application file for complete search history.

(56) References Cited

U.S. PATENT DOCUMENTS

| | | | | |
|---|---|---|---|---|
| 7,420,425 B2* | 9/2008 | Tsai | .................. | H03F 1/223 330/311 |
| 7,482,879 B2* | 1/2009 | Koutani | .............. | H01L 27/0207 330/254 |

(Continued)

FOREIGN PATENT DOCUMENTS

JP 2004-007706 1/2004

*Primary Examiner* — Henry Choe
(74) *Attorney, Agent, or Firm* — Michael Best & Friedrich LLP

(57) ABSTRACT

An amplifier includes a variable shunt circuit including a first transistor group and a second transistor group. The first transistor group includes at least one transistor including a first terminal connected directly or indirectly to a voltage-current conversion circuit, a second terminal connected directly or indirectly to a load, and a third terminal connected directly or indirectly to a control circuit. The second transistor group includes at least one transistor including a first terminal connected directly or indirectly to the voltage-current conversion circuit, a second terminal connected directly or indirectly to a power source or a ground, and a third terminal connected directly or indirectly to the control circuit. The amplifier is configured to amplify the input signal under exclusive control from the control circuit on a pair of the at least one transistor of the first transistor group and the at least one transistor of the second transistor group.

17 Claims, 10 Drawing Sheets

(51) Int. Cl.
*H03G 1/00* (2006.01)
*H03G 3/30* (2006.01)

(56) References Cited

U.S. PATENT DOCUMENTS

| | | | | |
|---|---|---|---|---|
| 8,081,033 B2* | 12/2011 | Kim | ............ | H03F 1/223 330/278 |
| 8,466,749 B2* | 6/2013 | Ahn | ............ | H03G 1/0029 330/311 |
| 2007/0222515 A1* | 9/2007 | Koutani | ............ | H01L 27/0207 330/254 |
| 2009/0134942 A1* | 5/2009 | Chang | ............ | H03F 1/223 330/311 |

* cited by examiner

AMPLIFIER, DRIVING METHOD FOR AMPLIFIER, AND ELECTRONIC CIRCUIT SYSTEM

CROSS REFERENCE TO RELATED APPLICATIONS

This application claims the benefit of Japanese Priority Patent Application JP 2014-051893 filed Mar. 14, 2014, the entire contents of which are incorporated herein by reference.

BACKGROUND

The present technology relates to an amplifier, a driving method for the amplifier, and an electronic circuit system, and more specifically, to an amplifier, a driving method for the amplifier, and an electronic circuit system that can secure variable gain ranges without an increase in circuit area.

In telecommunication systems and the like, variable gain amplifiers (VGA) are used to widen a dynamic range (refer, for example, to Japanese Patent Application Laid-open No. 2004-7706). According to Japanese Patent Application Laid-open No. 2004-7706, gain can be switched through digital control. With this, necessary variable gain ranges are secured.

FIG. 1 is a diagram of a configuration of a variable gain amplifier in related art.

In this variable gain amplifier, an input signal voltage to be input from an input terminal (RFIN) is converted to electric current at an NMOS transistor M1, and this electric current is split in accordance with a size ratio between an NMOS transistor M2 and an NMOS transistor M3 provided as a shunt unit cell. With this, a variable output signal voltage is output from a drain of the NMOS transistor M2 on a load side to an output terminal (RFOUT).

Further, gain of the variable gain amplifier of FIG. 1 can be expressed by the following equation (1).

$$\text{Gain} = \frac{Vout}{Vin} = \left(\frac{Gm(M2)}{Gm(M2) + Gm(M3)}\right) gm \times \text{Load} \quad (1)$$
$$= \alpha \times gm \times \text{Load}$$

In other words, in the variable gain amplifier of FIG. 1, of electric current to flow through the NMOS transistor M2 and the NMOS transistor M3, proportion of electric current to flow through the load is determined based on the size ratio between the NMOS transistor M2 and the NMOS transistor M3, and a gain factor $\alpha$ is expressed by $Gm(M2)/Gm(M2)+Gm(M3)$. Note that, in the equation (1), $Gm(M2)$ and $Gm(M3)$ respectively represent transconductances of the NMOS transistors M2 and M3, and gm represents a transconductance of the NMOS transistor M1.

Further, in order to obtain necessary variable gain ranges using the variable gain amplifier in related art, the configuration as shown in FIG. 2 is employed. Specifically, in the variable gain amplifier of FIG. 2, in order to obtain the necessary variable gain ranges, a plurality of shunt unit cells that have the same total size are arrayed.

More specifically, in the variable gain amplifier of FIG. 2, the NMOS transistors M2 and M3 are provided in a pair, and a control voltage V1 is input to gates of those transistors. Electric current of the NMOS transistor M2 is used, and a gain factor thereof is represented by $\alpha 1$. Further, NMOS transistors M4 and M5, and NMOS transistors M6 and M7 are respectively provided in pairs, and control voltages V2 and V3 are respectively input to gates of those pairs of transistors. Gain factors of those pairs are respectively represented by $\alpha 2$ and $\alpha 3$.

In a case where a threshold voltage is set to Vth and where the control voltages applied to the gates of the NMOS transistors satisfy the relationships of V1−V2>Vth and V1−V3>Vth, gain (Gain1) expressed by the following equation (2) is obtained.

$$\text{Gain1} = \alpha 1 \times gm \times \text{Load} \quad (2)$$

Similarly, in a case where the control voltages satisfy the relationships of V2−V1>Vth and V2−V3>Vth, gain (Gain2) expressed by the following equation (3) is obtained. Further, in a case where the control voltages satisfy the relationships of V3−V1>Vth and V3−V2>Vth, gain (Gain3) expressed by the following equation (4) is obtained.

$$\text{Gain2} = \alpha 2 \times gm \times \text{Load} \quad (3)$$

$$\text{Gain3} = \alpha 3 \times gm \times \text{Load} \quad (4)$$

In this way, in the variable gain amplifier of FIG. 2, in a case where a desired gain of, for example, 3 dB, −6 dB, or −9 dB is determined, the control voltages V1, V2, and V3 are applied in accordance with the gain respectively to the pairs of the gates of the NMOS transistors. With this, when the plurality of arrayed shunt unit cells are switched, necessary variable gain ranges can be obtained.

SUMMARY

However, in related art, in order to obtain necessary variable gain ranges, a plurality of shunt unit cells that have the same total size need to be arrayed. As a result, an increase in circuit area is inevitable. In view of the circumstances, there have been demands to overcome a trade-off between the variable gain range and a circuit area (cost) so that the variable gain ranges can be secured without an increase in circuit area.

In this way, there is a need to secure variable gain ranges without an increase in circuit area.

According to a first embodiment of the present technology, there is provided an amplifier, including a variable shunt circuit including a first transistor group, and a second transistor group provided correspondingly to the first transistor group, the first transistor group including at least one transistor that includes a first terminal connected directly or indirectly to a voltage-current conversion circuit configured to perform a voltage-current conversion of an input signal, a second terminal connected directly or indirectly to a load, and a third terminal connected directly or indirectly to a control circuit, the second transistor group including at least one transistor that includes a first terminal connected directly or indirectly to the voltage-current conversion circuit, a second terminal connected directly or indirectly to one of a power source and a ground, and a third terminal connected directly or indirectly to the control circuit, the amplifier being configured to amplify the input signal under exclusive control from the control circuit on a pair of the at least one transistor of the first transistor group and the at least one transistor of the second transistor group.

The at least one transistor of the first transistor group and the at least one transistor of the second transistor group may each include a MOS transistor of one of an N-type and a P-type, the first terminal of the at least one transistor of the first transistor group and the first terminal of the at least one transistor of the second transistor group may each include a source, the second terminal of the at least one transistor of the first transistor group and the second terminal of the at least one transistor of the second transistor group may each include a drain, and the third terminal of the at least one transistor of the first transistor group and the third terminal of the at least one transistor of the second transistor group may each include a gate.

The at least one transistor of the first transistor group and the at least one transistor of the second transistor group may each include a bipolar transistor of one of an NPN-type and a PNP-type, and the first terminal of the at least one transistor of the first transistor group and the first terminal of the at least one transistor of the second transistor group may each include an emitter, the second terminal of the at least one transistor of the first transistor group and the second terminal of the at least one transistor of the second transistor group may each include a collector, and the third terminal of the at least one transistor of the first transistor group and the third terminal of the at least one transistor of the second transistor group may each include a base.

The amplifier according to the first embodiment of the present technology may be differentiated.

According to the first embodiment of the present technology, there is also provided a driving method for the above-described amplifier according to the first embodiment of the present technology.

In the amplifier and the driving method according to the first embodiment of the present technology, the input signal is amplified under the exclusive control from the control circuit on the pair of the at least one transistor of the first transistor group and the at least one transistor of the second transistor group provided correspondingly to the first transistor group.

According to a second embodiment of the present technology, there is provided an amplifier, including a variable voltage-current conversion circuit including a first transistor group configured to perform a voltage-current conversion, and a second transistor group provided correspondingly to the first transistor group and configured to perform a voltage-current conversion, the first transistor group including at least one transistor that includes a first terminal connected directly or indirectly to a first switching element that is controlled by a control circuit, a second terminal connected directly or indirectly to a load, and a third terminal connected directly or indirectly to an input terminal to which an input signal is input, the second transistor group including at least one transistor that includes a first terminal connected directly or indirectly to a second switching element that is controlled by the control circuit, a second terminal connected directly or indirectly to one of a power source and a ground, and a third terminal connected directly or indirectly to the input terminal, the amplifier being configured to amplify the input signal under exclusive control from the control circuit on a pair of the first switching element connected directly or indirectly to the at least one transistor of the first transistor group and the second switching element connected directly or indirectly to the at least one transistor of the second transistor group.

The at least one transistor of the first transistor group and the at least one transistor of the second transistor group may each include a MOS transistor of one of an N-type and a P-type, the first terminal of the at least one transistor of the first transistor group and the first terminal of the at least one transistor of the second transistor group may each include a source, the second terminal of the at least one transistor of the first transistor group and the second terminal of the at least one transistor of the second transistor group may each include a drain, and the third terminal of the at least one transistor of the first transistor group and the third terminal of the at least one transistor of the second transistor group may each include a gate.

The at least one transistor of the first transistor group and the at least one transistor of the second transistor group may each include a bipolar transistor of one of an NPN-type and a PNP-type, the first terminal of the at least one transistor of the first transistor group and the first terminal of the at least one transistor of the second transistor group may each include an emitter, the second terminal of the at least one transistor of the first transistor group and the second terminal of the at least one transistor of the second transistor group may each include a collector, and the third terminal of the at least one transistor of the first transistor group and the third terminal of the at least one transistor of the second transistor group may each include a base.

The amplifier according to the second embodiment of the present technology may be differentiated.

According to the second embodiment of the present technology, there is also provided a driving method for the above-described amplifier according to the second embodiment of the present technology.

In the amplifier and the driving method according to the second embodiment of the present technology, the input signal is amplified under the exclusive control from the control circuit on the pair of the first switching element and the second switching element, the first switching element being connected to the at least one transistor of the first transistor group configured to perform the voltage-current conversion, the second switching element being connected to the at least one transistor of the second transistor group provided correspondingly to the first transistor group and configured to perform the voltage-current conversion.

According to a third embodiment of the present technology, there is provided an amplifier, including:
a cascode circuit including
a first transistor group, and
a second transistor group provided correspondingly to the first transistor group,
the first transistor group including at least one transistor that includes
a first terminal connected directly or indirectly to a voltage-current conversion circuit configured to perform a voltage-current conversion of an input signal,
a second terminal connected directly or indirectly to a load, and
a third terminal connected directly or indirectly to a control circuit,
the second transistor group including at least one transistor that includes
a first terminal connected directly or indirectly to the voltage-current conversion circuit,
a second terminal connected directly or indirectly to one of a power source and a ground, and
a third terminal connected directly or indirectly to the control circuit; and
a variable voltage-current conversion circuit including
a third transistor group configured to serve as the voltage-current conversion circuit and to perform the voltage-current conversion, and
a fourth transistor group provided correspondingly to the third transistor group and configured to perform a voltage-current conversion,
the third transistor group including at least one transistor that includes
a first terminal connected directly or indirectly to a first switching element that is controlled by the control circuit,
a second terminal connected directly or indirectly to the load, and
a third terminal connected directly or indirectly to an input terminal to which the input signal is input,
the fourth transistor group including at least one transistor that includes
a first terminal connected directly or indirectly to a second switching element that is controlled by the control circuit,
a second terminal connected directly or indirectly to one of the power source and the ground, and
a third terminal connected directly or indirectly to the input terminal,
the amplifier being configured to amplify the input signal under exclusive control from the control circuit on a pair of the at least one transistor of the first transistor group and the at least one transistor of the second transistor group,
the amplifier being configured to amplify the input signal under exclusive control from the control circuit on a pair of the first switching element connected directly or indirectly to the at least one transistor of the third transistor group and the second switching element connected directly or indirectly to the at least one transistor of the fourth transistor group.

The at least one transistor of the first transistor group, the at least one transistor of the second transistor group, the at least one transistor of the third transistor group, and the at least one transistor of the fourth transistor group may each include a MOS transistor of one of an N-type and a P-type,
the first terminal of the at least one transistor of the first transistor group, the first terminal of the at least one transistor of the second transistor group, the first terminal of the at least one transistor of the third transistor group, and the first terminal of the at least one transistor of the fourth transistor group may each include a source,
the second terminal of the at least one transistor of the first transistor group, the second terminal of the at least one transistor of the second transistor group, the second terminal of the at least one transistor of the third transistor group, and the second terminal of the at least one transistor of the fourth transistor group may each include a drain, and
the third terminal of the at least one transistor of the first transistor group, the third terminal of the at least one transistor of the second transistor group, the third terminal of the at least one transistor of the third transistor group, and the third terminal of the at least one transistor of the fourth transistor group may each include a gate.

The at least one transistor of the first transistor group, the at least one transistor of the second transistor group, the at least one transistor of the third transistor group, and the at least one transistor of the fourth transistor group may each include a bipolar transistor of one of an NPN-type and a PNP-type,
the first terminal of the at least one transistor of the first transistor group, the first terminal of the at least one transistor of the second transistor group, the first terminal of the at least one transistor of the third transistor group, and the first terminal of the at least one transistor of the fourth transistor group may each include an emitter,
the second terminal of the at least one transistor of the first transistor group, the second terminal of the at least one transistor of the second transistor group, the second terminal of the at least one transistor of the third transistor group, and the second terminal of the at least one transistor of the fourth transistor group may each include a collector, and
the third terminal of the at least one transistor of the first transistor group, the third terminal of the at least one transistor of the second transistor group, the third terminal of the at least one transistor of the third transistor group, and the third terminal of the at least one transistor of the fourth transistor group may each include a base.

The amplifier according to the third embodiment of the present technology may be differentiated.

According to the third embodiment of the present technology, there is also provided a driving method for the above-described amplifier according to the third embodiment of the present technology.

In the amplifier and the driving method according to the third embodiment of the present technology, the input signal is amplified under the exclusive control from the control circuit on the pair of the at least one transistor of the first transistor group and the at least one transistor of the second transistor group provided correspondingly to the first transistor group. The input signal is amplified also under the exclusive control from the control circuit on the pair of the first switching element and the second switching element, the first switching element being connected to the at least one transistor of the third transistor group configured to serve as the voltage-current conversion circuit and to perform the voltage-current conversion, the second switching element being connected to the at least one transistor of the fourth transistor group provided correspondingly to the third transistor group and configured to perform the voltage-current conversion.

According to a fourth embodiment of the present technology, there is provided an electronic circuit system, including:
an amplifier; and
a control circuit configured to control operations of the amplifier, the amplifier including a variable shunt circuit including
a first transistor group, and
a second transistor group provided correspondingly to the first transistor group,
the first transistor group including at least one transistor that includes
a first terminal connected directly or indirectly to a voltage-current conversion circuit configured to perform a voltage-current conversion of an input signal,
a second terminal connected directly or indirectly to a load, and
a third terminal connected directly or indirectly to the control circuit,
the second transistor group including at least one transistor that includes
a first terminal connected directly or indirectly to the voltage-current conversion circuit,
a second terminal connected directly or indirectly to one of a power source and a ground, and
a third terminal connected directly or indirectly to the control circuit,
the control circuit being configured to perform exclusive control on a pair of the at least one transistor of the first transistor group and the at least one transistor of the second transistor group.

In the electronic circuit system according to the fourth embodiment of the present technology, the control circuit performs the exclusive control on the pair of the at least one transistor of the first transistor group and the at least one transistor of the second transistor group provided correspondingly to the first transistor group.

According to a fifth embodiment of the present technology, there is provided an electronic circuit system, including:
an amplifier; and
a control circuit configured to control operations of the amplifier,
the amplifier including a variable voltage-current conversion circuit including
a first transistor group configured to perform a voltage-current conversion, and
a second transistor group provided correspondingly to the first transistor group and configured to perform a voltage-current conversion,
the first transistor group including at least one transistor that includes
a first terminal connected directly or indirectly to a first switching element that is controlled by the control circuit,
a second terminal connected directly or indirectly to a load, and
a third terminal connected directly or indirectly to an input terminal to which an input signal is input,
the second transistor group including at least one transistor that includes
a first terminal connected directly or indirectly to a second switching element that is controlled by the control circuit,
a second terminal connected directly or indirectly to one of a power source and a ground, and
a third terminal connected directly or indirectly to the input terminal,
the control circuit being configured to perform exclusive control on a pair of the first switching element connected directly or indirectly to the at least one transistor of the first transistor group and the second switching element connected directly or indirectly to the at least one transistor of the second transistor group.

In the electronic circuit system according to the fifth embodiment of the present technology, the control circuit performs the exclusive control on the pair of the first switching element and the second switching element, the first switching element being connected to the at least one transistor of the first transistor group configured to perform the voltage-current conversion, the second switching element being connected to the at least one transistor of the second transistor group provided correspondingly to the first transistor group and configured to perform the voltage-current conversion.

According to a sixth embodiment of the present technology, there is provided an electronic circuit system, including:
an amplifier; and
a control circuit configured to control operations of the amplifier,
the amplifier including
a cascode circuit including
a first transistor group, and
a second transistor group provided correspondingly to the first transistor group,
the first transistor group including at least one transistor that includes
a first terminal connected directly or indirectly to a voltage-current conversion circuit configured to perform a voltage-current conversion of an input signal,
a second terminal connected directly or indirectly to a load, and
a third terminal connected directly or indirectly to the control circuit,
the second transistor group including at least one transistor that includes
a first terminal connected directly or indirectly to the voltage-current conversion circuit,
a second terminal connected directly or indirectly to one of a power source and a ground, and
a third terminal connected directly or indirectly to the control circuit; and
a variable voltage-current conversion circuit including
a third transistor group configured to serve as the voltage-current conversion circuit and to perform the voltage-current conversion, and
a fourth transistor group provided correspondingly to the third transistor group and configured to perform a voltage-current conversion,
the third transistor group including at least one transistor that includes
a first terminal connected directly or indirectly to a first switching element that is controlled by the control circuit,
a second terminal connected directly or indirectly to the load, and
a third terminal connected directly or indirectly to an input terminal to which the input signal is input,
the fourth transistor group including at least one transistor that includes
a first terminal connected directly or indirectly to a second switching element that is controlled by the control circuit,
a second terminal connected directly or indirectly to one of the power source and the ground, and a third terminal connected directly or indirectly to the input terminal, the control circuit being configured to perform exclusive control on a pair of the at least one transistor of the first transistor group and the at least one transistor of the second transistor group, the control circuit being configured to perform exclusive control on a pair of the first switching element connected directly or indirectly to the at least one transistor of the third transistor group and the second switching element connected directly or indirectly to the at least one transistor of the fourth transistor group.

In the electronic circuit system according to the sixth embodiment of the present technology, the control circuit performs the exclusive control on the pair of the at least one transistor of the first transistor group and the at least one transistor of the second transistor group provided correspondingly to the first transistor group. The control circuit also performs the exclusive control on the pair of the first switching element and the second switching element, the first switching element being connected to the at least one transistor of the third transistor group configured to serve as the voltage-current conversion circuit and to perform the voltage-current conversion, the second switching element being connected to the at least one transistor of the fourth transistor group provided correspondingly to the third transistor group and configured to perform the voltage-current conversion.

According to the first to sixth embodiments of the present technology, variable gain ranges can be secured without an increase in circuit area.

Note that, advantages of the above-described embodiments of the present disclosure are not necessarily limited to this advantage, and may include any other advantages described in the present disclosure.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present technology will be described with reference to the drawings. Note that, the description is made in the following order.

1. System configuration
2. First embodiment (Configuration of variable shunt circuit)
3. Second embodiment (Configuration of variable voltage-current conversion circuit)
4. Third embodiment (Combination of variable shunt circuit and variable voltage-current conversion circuit)
5. Modification (1. System Configuration)

Figure 1:
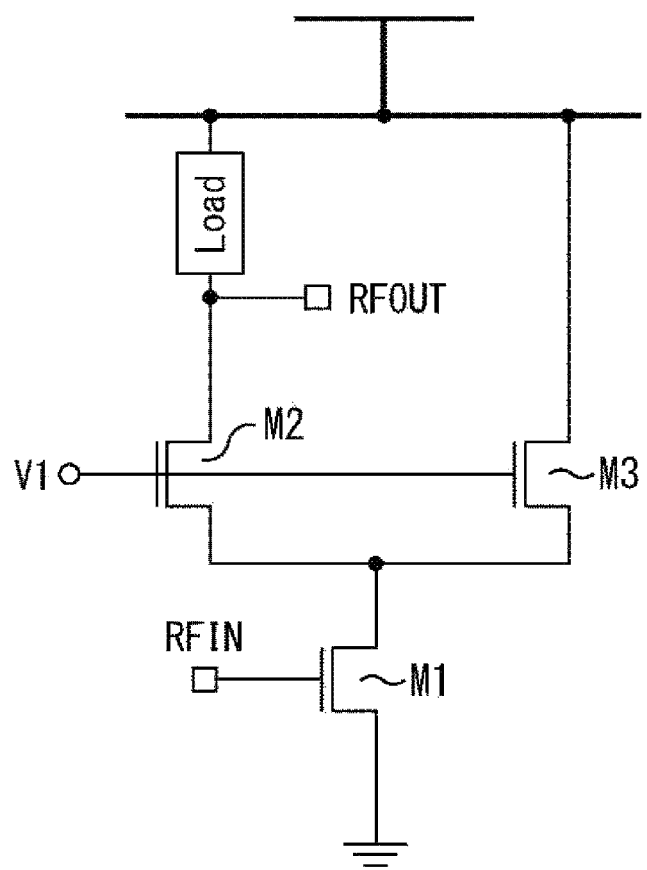
FIG. 1 is a circuit diagram of a configuration of a variable gain amplifier in related art.
Figure 2:
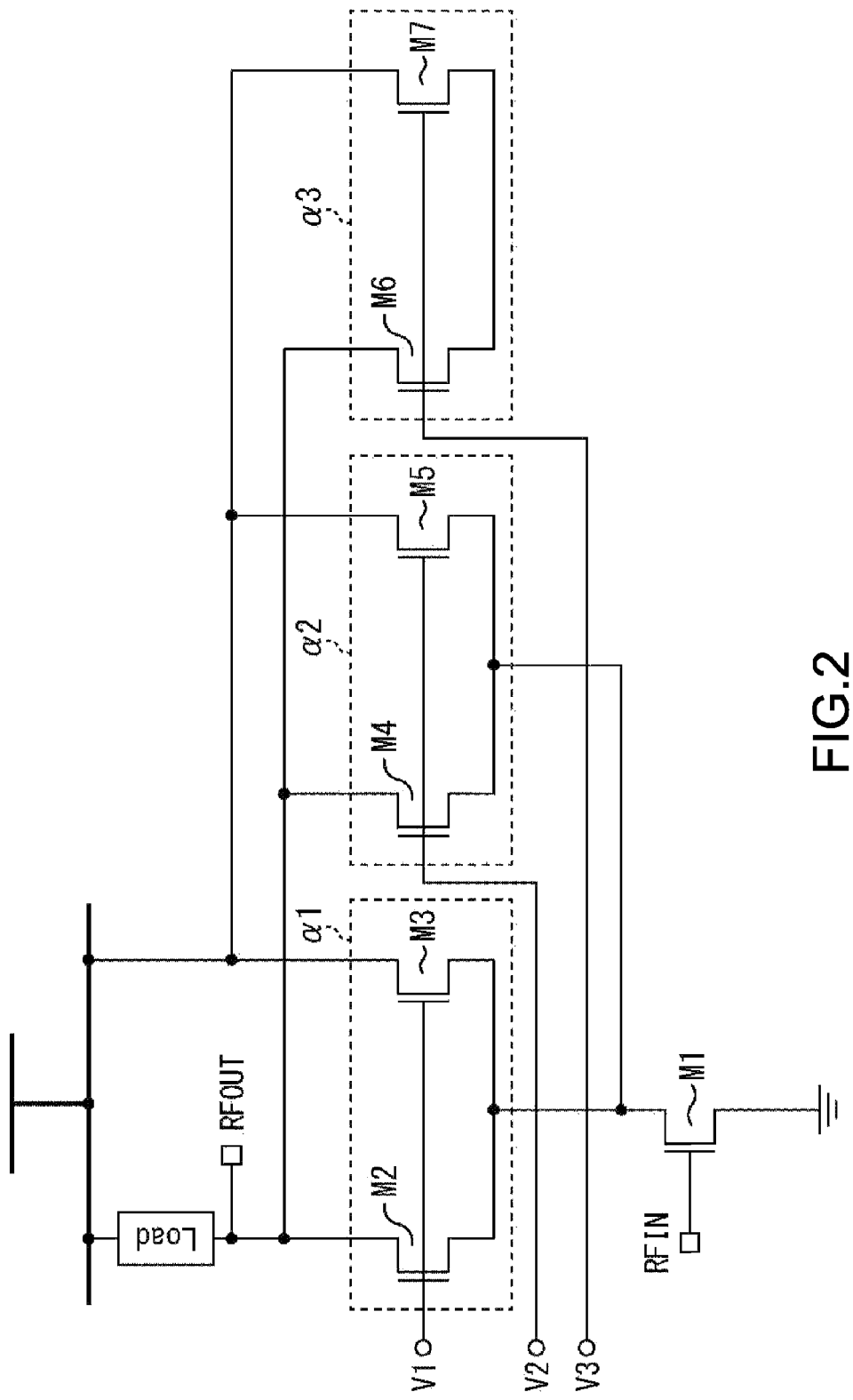
FIG. 2 is a circuit diagram of a configuration of another variable gain amplifier in related art.
Figure 3:
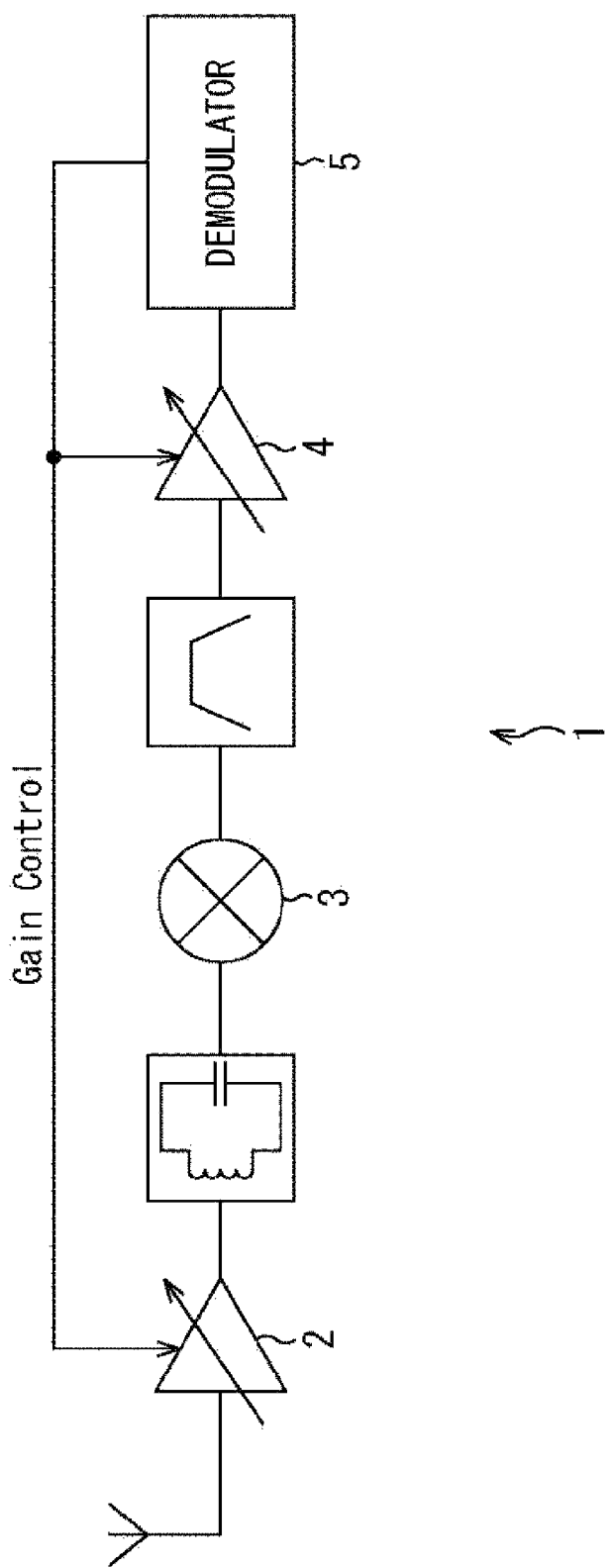
FIG. 3 is a block diagram of a configuration example of a receiver.

FIG. 3 is a block diagram of a configuration example of a receiver of a communication system.

In a receiver 1, an RF (Radio Frequency) signal that is input via an antenna is converted to an IF (Intermediate Frequency) signal by a mixer 3. Further, the receiver 1 includes an RF variable gain amplifier 2 and an IF variable gain amplifier 4. The RF variable gain amplifier 2 is configured to amplify a gain of the RF signal under gain control from a demodulator 5. Further, the IF variable gain amplifier 4 is configured to amplify a gain of the IF signal under gain control from the demodulator 5. With this, necessary ranges of gain between the RF signal and the IF signal can be obtained.

Figure 4:
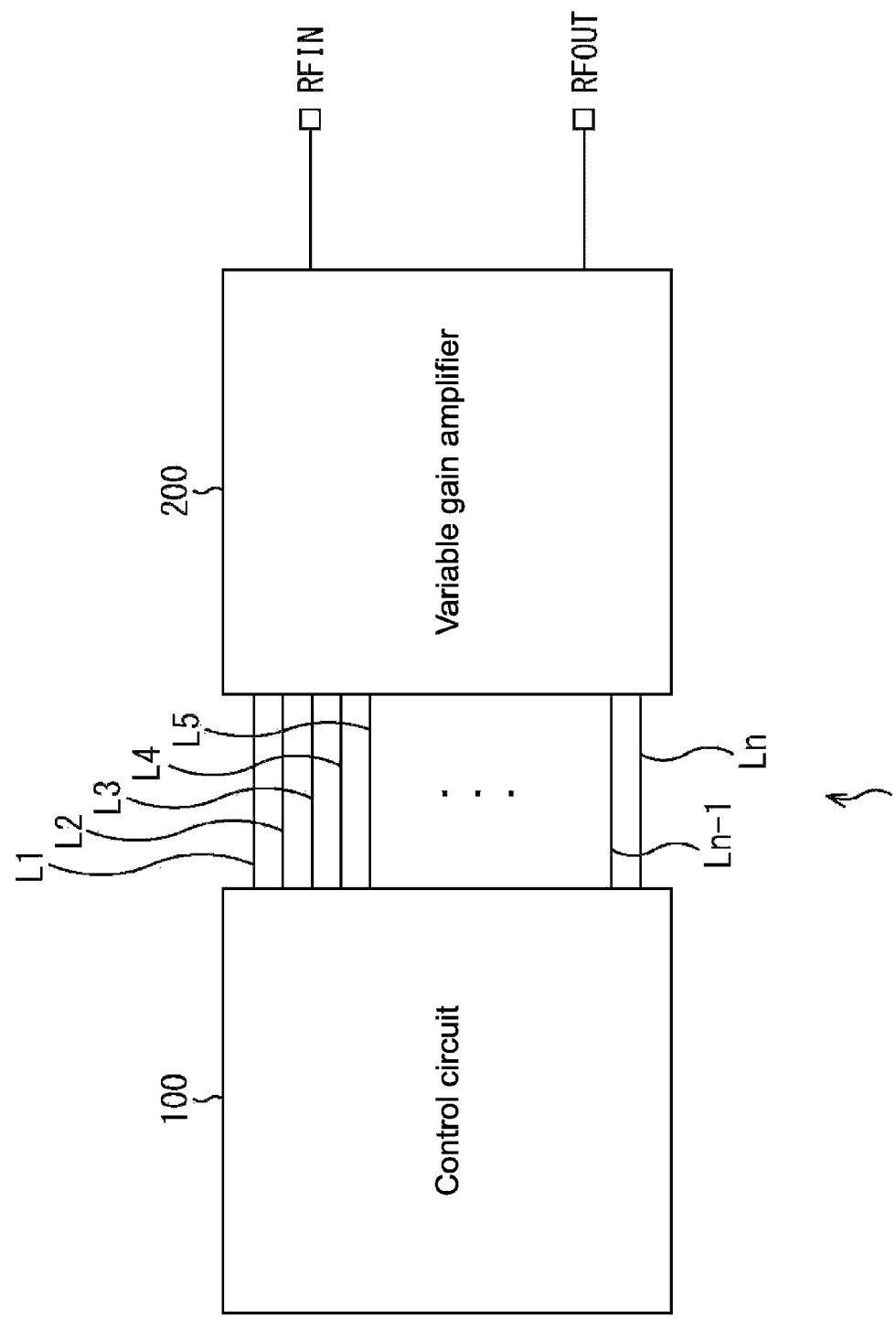
FIG. 4 is a block diagram of a configuration of an electronic circuit system according to an embodiment of the present technology.

FIG. 4 is a block diagram of a configuration of an electronic circuit system to which the present technology is applied.

As shown in FIG. 4, in an electronic circuit system 10, a control circuit 100 and a variable gain amplifier 200 are connected to each other through intermediation of control lines L1 to Ln (n=1, 2, . . . , N). Note that, the electronic circuit system 10 of FIG. 4 serves as a part of the receiver 1 of FIG. 3. Specifically, in the electronic circuit system 10 of FIG. 4, the control circuit 100 corresponds to the demodulator 5 of FIG. 3, and the variable gain amplifier 200 corresponds to the RF variable gain amplifier 2 or the IF variable gain amplifier 4 of FIG. 3.

The control circuit 100 is configured to digitally control a variable range of the gain of the variable gain amplifier 200 via the control lines L1 to Ln. Specifically, the control circuit 100 generates binary signals (control voltages) for controlling the variable range of the gain of the variable gain amplifier 200, and outputs the binary signals to the variable gain amplifier 200. Note that, the binary signals may be converted to what is called thermometer codes, and the variable gain amplifier 200 can be controlled with the thermometer codes.

The variable gain amplifier 200 is configured to switch gain between input from an input terminal (RFIN) and output from an output terminal (RFOUT) under digital control from the control circuit 100. With this, necessary variable gain ranges are secured.

Note that, in the following, how the variable gain amplifier 200 is capable of amplifying gains between various signals such as the RF signal and the IF signal as described above is described by way of an example of gain that is obtained through amplification between input to the input terminal (RFIN) and output from the output terminal (RFOUT) of the RF signal. Further, in the following description, three embodiments of a first embodiment to a third embodiment are described as configurations of the variable gain amplifier 200.

(2. First Embodiment)

Figure 5:
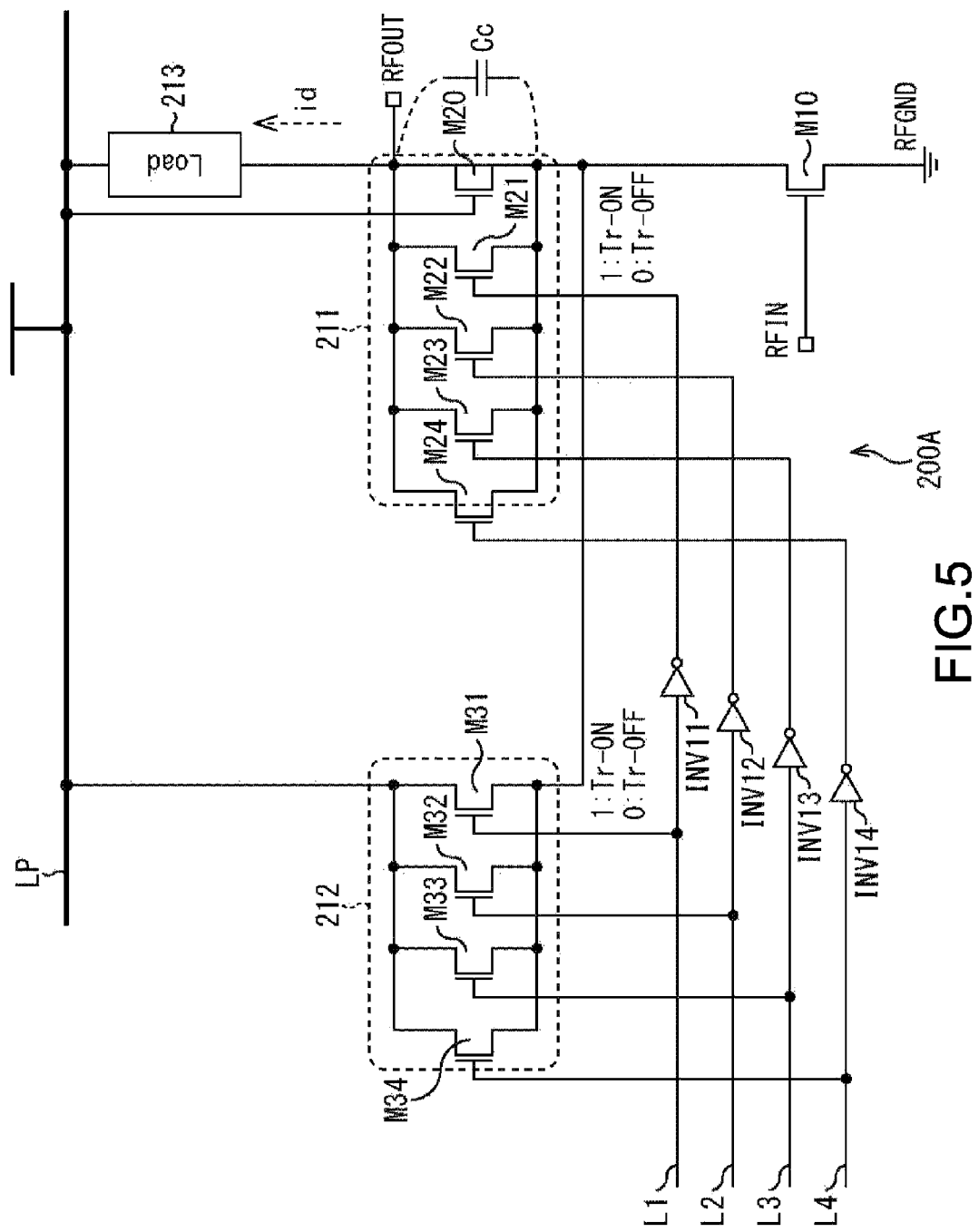
FIG. 5 is a circuit diagram of a configuration of a variable gain amplifier according to a first embodiment of the present technology.

FIG. 5 is a circuit diagram of a configuration of a variable gain amplifier according to the first embodiment of the present technology.

A variable gain amplifier 200A of FIG. 5 is an amplifier that is capable of securing necessary variable gain ranges by switching the gain between the input from the input terminal (RFIN) and the output from the output terminal (RFOUT) under the digital control from the control circuit 100 (FIG. 4).

As shown in FIG. 5, the variable gain amplifier 200A includes an NMOS transistor M10, a first transistor group 211 including NMOS transistors M20 to M24, and a second transistor group 212 including NMOS transistors M31 to M34.

A source of the NMOS transistor M10 is connected to an RF ground (RFGND), a drain thereof is connected to a source of the NMOS transistor M20, and a gate thereof connected to the input terminal (RFIN). The NMOS transistor M10 is configured to convert an input signal voltage from the input terminal (RFIN) to electric current. The electric current obtained through the voltage-current conversion by the NMOS transistor M10 is input to the first transistor group 211 and the second transistor group 212.

The first transistor group 211 and the second transistor group 212 are provided in a pair, and equal to each other in number of the connected NMOS transistors and in size.

In the first transistor group 211, the source of the NMOS transistor M20 is connected to the drain of the NMOS transistor M10, a drain thereof is connected to a load 213, and a gate thereof is connected to a power supply line LP. Sources of the NMOS transistors M21 to M24 are connected to between the drain of the NMOS transistor M10 and the source of the NMOS transistor M20, and drains thereof are connected to between the drain of the NMOS transistor M20 and the load 213. Further, gates of the NMOS transistors M21 to M24 are connected to inverters INV11 to INV14, and connected to the control circuit 100 through intermediation of the control lines L1 to L4.

In the second transistor group 212, a source of the NMOS transistor M31 is connected to between the drain of the NMOS transistor M10 and the source of the NMOS transistor M20, a drain thereof is connected to the power supply line LP, and a gate thereof is connected to the control circuit 100 through intermediation of the control line L1. Further, sources of the NMOS transistors M32 to M34 are connected to between the drain of the NMOS transistor M10 and the source of the NMOS transistor M20, and drains thereof are connected to between the drain of the NMOS transistor M31 and the power supply line LP. Gates of the NMOS transistors M32 to M34 are connected to the control circuit 100 through intermediation of the control lines L2 to L4.

In this way, in the variable gain amplifier 200A, the sources of the NMOS transistors M20 to M24 of the first transistor group 211 on the load 213 side are connected to the input terminal (RFIN) through intermediation of the NMOS transistor M10, and the drains thereof are connected to the output terminal (RFOUT). Meanwhile, the sources of the NMOS transistors M31 to M34 of the second transistor group 212 are connected to the input terminal (RFIN) through intermediation of the NMOS transistor M10, and the drains thereof are connected to the power supply line LP.

In the variable gain amplifier 200A, the input signal voltage from the input terminal (RFIN) is converted to electric current by the NMOS transistor M10. The digital control is performed by inputting the control voltages from the control circuit 100 to the first transistor group 211 and the second transistor group 212 provided as a variable shunt circuit via the control lines L1 to L4. With this, variable output signal voltages are output from the first transistor group 211 on the load 213 side to the output terminal (RFOUT).

Specifically, the control voltages from the control circuit 100 are input via the control lines L1 to L4 to the gates of the NMOS transistors M21 to M24 of the first transistor group 211 and to the gates of the NMOS transistors M31 to M34 of the second transistor group 212.

Note that, the gates of the NMOS transistors M21 to M24 of the first transistor group 211 are connected respectively to the inverters INV11 to INV14 so that levels of the control voltages from the control circuit 100 are inverted by the inverters INV11 to INV14 before input to the gates of the NMOS transistors M21 to M24.

Specifically, when the control voltage at an H level or an L level is input from the control circuit 100 via the control line L1, this control voltage is input to the gate of the NMOS transistor M31 of the second transistor group 212, and input also to the gate of the NMOS transistor M21 of the first transistor group 211 through the inversion to the H level or the L level by the inverter INV11.

Similarly, when the control voltages at the H level or the L level are input from the control circuit 100 via the control lines L2 to L4, those control voltages are input to the gates of the NMOS transistors M32 to M34 of the second transistor group 212, and input also to the gates of the NMOS transistors M22 to M24 of the first transistor group 211 through the inversions to the H level or the L level by the inverters INV12 to INV14.

Through such digital control, across the first transistor group 211 and the second transistor group 212 provided in a pair, the NMOS transistors M21 and M31, the NMOS transistors M22 and M32, the NMOS transistors M23 and M33, and the NMOS transistors M24 and M34 are exclusively controlled in respective pairs. In other words, the pairs of the NMOS transistors M21 to M24 of the first transistor group 211 and the NMOS transistors M31 to M34 of the second transistor group 212 are exclusively controlled through the digital control by the control circuit 100.

For example, the digital control is performed such that the control voltages each at the H level are input to the gates of the NMOS transistors M21 to M24 and that the control voltages each at the L level are input to the gates of the NMOS transistors M31 to M34. With this, in the first transistor group 211 on the load 213 side, electric current flows through the NMOS transistors M21 to M24. As a result, higher gain (hereinafter, referred to as "high gain") can be obtained.

Next, in order to reduce the high gain (of, for example, 6 dB), the digital control is performed such that the level of the control voltage input from the control circuit 100 to the control line L1 is changed from the L level to the H level, whereby the control voltage at the L level is input to the gate of the NMOS transistor M21, and the control voltage at the H level is input to the gate of the NMOS transistor M31.

Through this digital control, in the first transistor group 211, the control voltages each at the H level are input to the gates of the NMOS transistors M22 to M24, but the control voltage at the L level is input to the NMOS transistor M21. Meanwhile, in the second transistor group 212, the control voltages each at the L level are input to the gates of the NMOS transistors M32 to M34, but the control voltage at the H level is input to the gate of the NMOS transistor M31. As a result, the electric current, which has flown through the NMOS transistor M21 on the load 213 side under a state in which the high gain is obtained, flows into the power supply line LP side via the NMOS transistor M31. With this change of the flow of the electric current, the gain of, for example, 6 dB can be reduced.

Next, in order to further reduce the gain (of, for example, 6 dB), the digital control is performed such that the level of the control voltage input to the control line L2 is changed from the L level to the H level, whereby the control voltage at the L level is input to the gate of the NMOS transistor M22, and the control voltage at the H level is input to the gate of the NMOS transistor M32. Through this digital control, the electric current, which has flown through the NMOS transistor M22 on the load 213 side, flows into the power supply line LP side via the NMOS transistor M32. With this change of the flow of the electric current, the gain of, for example, 6 dB can be further reduced.

Similarly, the gain can be further reduced only by changing the levels of the control voltages to be input to the control lines L3 and L4 from the L level to the H level. By changing the levels of the control voltages in this way, the electric current, which has flown through the NMOS transistors M23 and M24 on the load 213 side, flows into the power supply line LP side via the NMOS transistors M33 and M34. With those changes of the flow of the electric current, the gain can be further reduced.

In other words, the digital control is performed such that the control voltages each at the L level are input to the gates of the NMOS transistors M21 to M24 on the load 213 side and that the control voltages each at the H level are input to the gates of the NMOS transistors M31 to M34 on the power supply line LP side. With this, in the second transistor group 212, electric current flows through the NMOS transistors M31 to M34. As a result, lower gain (hereinafter, referred to as "low gain") can be obtained.

Note that, in order to expand the range between the high gain and the low gain in the above-described configuration in which the four pairs of the NMOS transistors are digitally controlled across the first transistor group 211 and the second transistor group 212 in the variable gain amplifier 200A of FIG. 5, a larger number of pairs of the NMOS transistors may be provided across the first transistor group 211 and the second transistor group 212. In other words, the number of pairs of the NMOS transistors is not particularly limited as long as at least one pair of the NMOS transistors is provided.

In this way, in the variable gain amplifier 200A of FIG. 5, the first transistor group 211 and the second transistor group 212 have the same size. A circuit area (cost) substantially doubles in comparison with that in a case where the first transistor group 211 is provided alone. However, through exclusive control on those pairs of the NMOS transistors, arbitrary gain can be obtained.

Specifically, in the above-described variable gain amplifier in related art in which a plurality of shunt unit cells that have the same total size need to be arrayed to obtain arbitrary gain, a trade-off relationship exists between the variable gain range and the circuit area. However, this trade-off between the variable gain range and the circuit area (cost) is overcome although a circuit area substantially doubles due to the provision of the pair of the first transistor group 211 and the second transistor group 212 in the variable gain amplifier 200A of FIG. 5. With this, arbitrary gain can be obtained.

More specifically, in FIG. 5, in consideration of a parasitic capacitance Cc to be generated between the source and the drain of the NMOS transistor M20, electric current id to flow through the drain side of the NMOS transistor M20 is expressed by the following equation (5).

$$id = \left(\frac{Gm(1) + \omega Cc}{Gm(1) + Gm(2) + \omega Cc}\right) gm \times Vin \quad (5)$$

Note that, in the equation (5), Gm(1) and Gm(2) respectively represent transconductances of the first transistor group 211 and the second transistor group 212. Further, gm represents a transconductance of the NMOS transistor M10. In addition, ω represents an angular frequency.

Further, Vout can be expressed by the following equation (6) using the equation (5), and hence the gain of the variable gain amplifier 200A of FIG. 5 can be expressed by the following equation (7).

$$Vout = id \times \text{Load} = \left(\frac{Gm(1) + \omega Cc}{Gm(1) + Gm(2) + \omega Cc}\right) gm \times Vin \times \text{Load} \quad (6)$$

$$\text{Gain} = \frac{Vout}{Vin} = \left(\frac{Gm(1) + \omega Cc}{Gm(1) + Gm(2) + \omega Cc}\right) gm \times \text{Load} \quad (7)$$

Note that, the angular frequency ω can be obtained from 2πf, and hence influence of ωCc becomes more significant when a value of a frequency f(Hz) is large. However, when the value of the frequency f(Hz) is small, ωCc can be ignored. Therefore, in the equation (7), when the relationship of Gm(1)>>ωCc is satisfied, gain can be obtained by the following equation (8).

$$\text{Gain} = \frac{Vout}{Vin} = \left(\frac{Gm(1)}{Gm(1) + Gm(2)}\right) gm \times \text{Load} = \alpha \times gm \times \text{Load} \quad (8)$$

Note that, in the equation (8), α represents a gain factor.

Further, in the equation (7), when the relationship of Gm(1)<<ωCc is satisfied, gain can be obtained by the following equation (9).

$$\text{Gain} = \frac{Vout}{Vin} = \left(\frac{\omega Cc}{\omega Cc + Gm(2)}\right) gm \times \text{Load} \quad (9)$$

In this way, gain can be obtained through calculation using the equation (8) or the equation (9) in accordance with relationship between Gm(1) and ωCc.

As described above, in the first embodiment, the second transistor group 212 and the first transistor group 211 are provided in a pair as the variable shunt circuit, and the pairs of the NMOS transistors are subjected to exclusive digital control across those transistor groups. As a result, a circuit area substantially doubles in comparison with that in a case where the first transistor group 211 is provided alone. However, the trade-off between the variable gain range and the circuit area (cost) can be overcome, and arbitrary gain can be obtained.

(3. Second Embodiment)

Incidentally, in the variable gain amplifier 200A of FIG. 5, when a wide variable gain range is secured, gain is determined based on a ratio between the parasitic capacitance Cc and the transconductances of the second transistor group 212 connected to the alternating-current ground. As a result, variable gain linearity is deteriorated. Specifically, as shown in FIG. 6 as simulation results (DNL (Differential Nonlinearity)), the variable gain linearity, which is ideally maintained at 3 dB, is deteriorated by influence of the parasitic capacitance Cc in and near a region encircled by C1 in FIG. 6.

Figure 6:
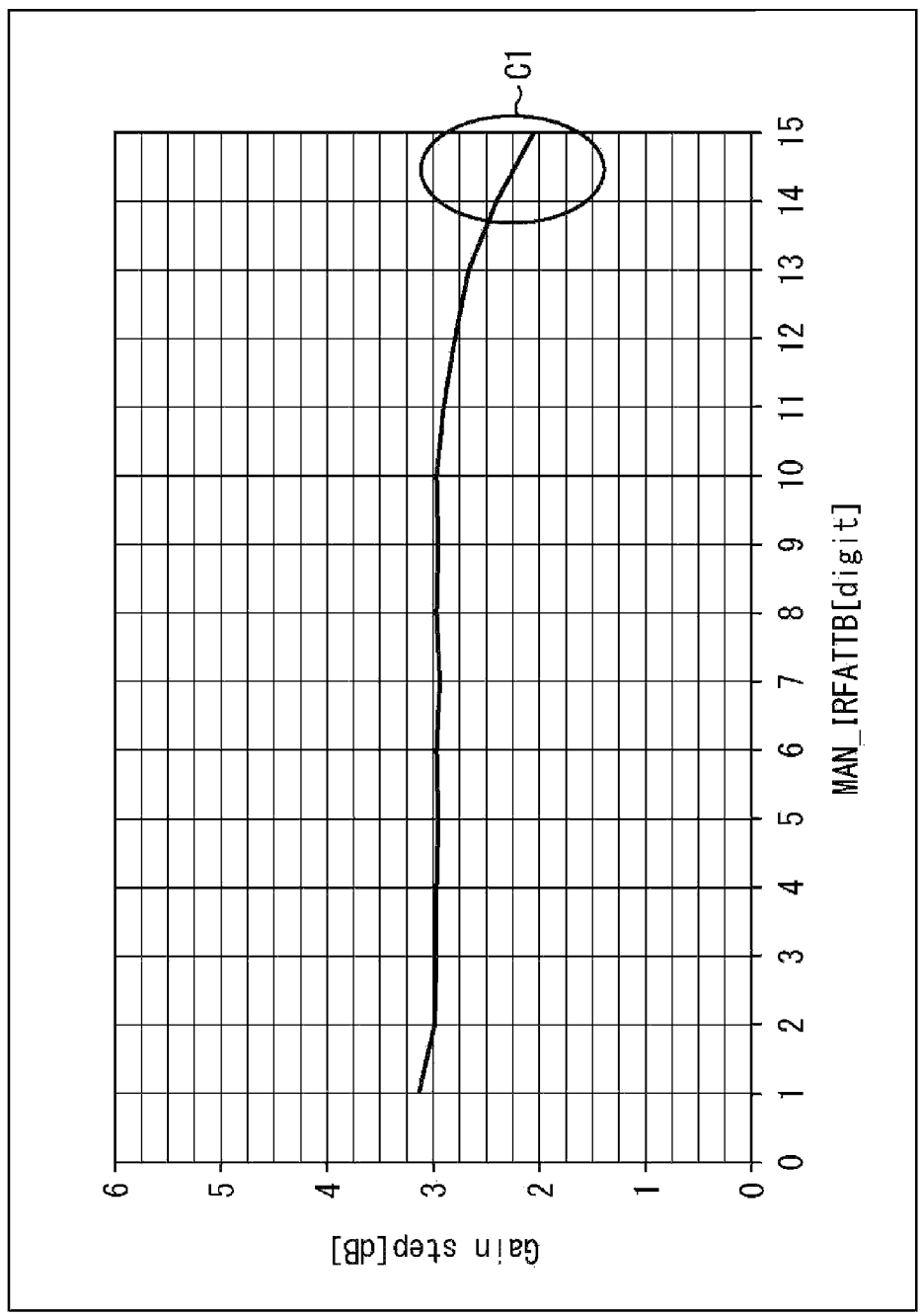
FIG. 6 is a graph showing simulation results using the configuration of the first embodiment.

As a countermeasure, in the second embodiment, a configuration of a variable voltage-current conversion circuit is used instead of the configuration of the variable shunt circuit according to the first embodiment so that the deterioration in variable gain linearity as shown in FIG. 6 as the simulation results is suppressed.

Figure 7:
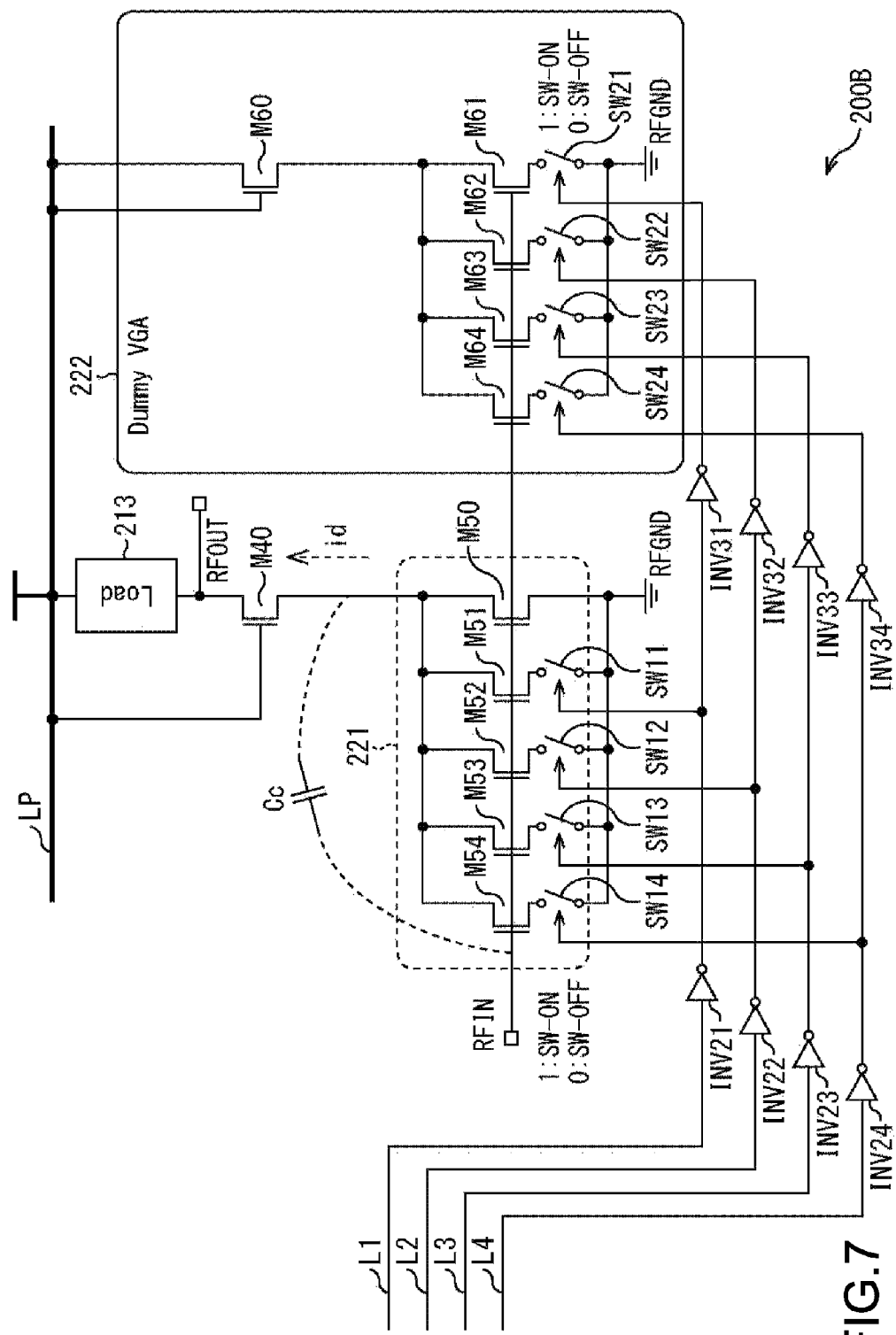
FIG. 7 is a circuit diagram of a configuration of a variable gain amplifier according to a second embodiment of the present technology.

FIG. 7 is a circuit diagram of a configuration of a variable gain amplifier according to the second embodiment of the present technology.

A variable gain amplifier 200B of FIG. 7 is an amplifier configured to switch gain between the input from the input terminal (RFIN) and the output from the output terminal (RFOUT) under the digital control from the control circuit 100 (FIG. 4) so that necessary variable gain ranges are secured.

As shown in FIG. 7, the variable gain amplifier 200B includes an NMOS transistor M40, a first transistor group 221 including NMOS transistors M50 to M54, and a second transistor group 222 including NMOS transistors M60 to M64. Note that, although not described in detail here, the second transistor group 222 is a dummy variable gain amplifier (Dummy VGA) circuit provided to improve the above-mentioned variable gain linearity.

A source of the NMOS transistor M40 is connected to the first transistor group 221, a drain thereof is connected to the load 213, and a gate thereof is connected to the power supply line LP. Further, the output terminal (RFOUT) is connected to between the drain of the NMOS transistor M40 and the load 213.

In the first transistor group 221, a source of the NMOS transistor M50 is connected to the RF ground (RFGND), and a drain thereof is connected to the source of the NMOS transistor M40. Sources of the NMOS transistors M51 to M54 are connected respectively to one ends of switches SW11 to SW14, and drains thereof are connected to between the source of the NMOS transistor M40 and the drain of the NMOS transistor M50. Further, gates of the NMOS transistors M50 to M54 are connected to the input terminal (RFIN).

The one ends of the switches SW11 to SW14 are connected respectively to the sources of the NMOS transistors M51 to M54, and other ends thereof are connected to between the source of the NMOS transistor M50 and the RF ground (RFGND). Further, the switches SW11 to SW14 are connected to the control circuit 100 through intermediation of the control lines L1 to L4, and configured to perform switching operations in response to the control voltages that are input via inverters INV21 to INV24.

In the second transistor group 222, a source of the NMOS transistor M60 is connected to a drain of the NMOS transistor M61, and a drain and a gate thereof are connected to the power supply line LP. Sources of the NMOS transistors M61 to M64 are connected respectively to one ends of switches SW21 to SW24, and drains thereof are connected to the source of the NMOS transistor M60. Further, gates of the NMOS transistors M61 to M64 are connected to the input terminal (RFIN).

The one ends of the switches SW21 to SW24 are connected respectively to the sources of the NMOS transistors M61 to M64, and other ends thereof are connected to the RF ground (RFGND). The switches SW21 to SW24 are connected to the control circuit 100 through intermediation of the control lines L1 to L4, and configured to perform switching operations in response to the control voltages that are input via the inverters INV21 to INV24 and inverters INV31 to INV34.

In this way, in the variable gain amplifier 200B, the gates of the NMOS transistors M50 to M54 of the first transistor group 221 on the load 213 side are connected to the input terminal (RFIN), and the drains thereof are connected to the output terminal (RFOUT) through intermediation of the NMOS transistor M40. Meanwhile, the gates of the NMOS transistors M61 to M64 of the second transistor group 222 are connected to the input terminal (RFIN), and the drains thereof are connected to the power supply line LP through intermediation of the NMOS transistor M60.

In the variable gain amplifier 200B, the digital control is performed by inputting the control voltages from the control circuit 100 to the first transistor group 221 as a variable voltage-current conversion circuit via the control lines L1 to L4. With this, the input signal voltage from the input terminal (RFIN) is converted to electric current, and variable output signal voltages are output to the output terminal (RFOUT). Further, exclusive control with respect to the variable voltage-current conversion circuit is performed by inputting the control voltages from the control circuit 100 to the second transistor group 222 as a dummy variable gain amplifier (Dummy VGA) circuit via the control lines L1 to L4. With this, variation in total electric current of the circuits can be suppressed at the time when variable gain is obtained through the voltage-current conversions by the first transistor group 221.

Specifically, the control voltages from the control circuit 100 are input via the control lines L1 to L4 to the switches SW11 to SW14 of the first transistor group 221 and the switches SW21 to SW24 of the second transistor group 222.

Note that, the inverters INV21 to INV24 and the inverters INV31 to INV34 are connected respectively to the control lines L1 to L4 so that levels of the control voltages from the control circuit 100 are inverted by the inverters INV21 to INV24 before input to the switches SW11 to SW14. Further, the control voltages inverted by the inverters INV21 to INV24 are additionally inverted by the inverters INV31 to INV34 before input to the switches SW21 to SW24.

Specifically, when the control voltage at the H level or the L level is input from the control circuit 100 via the control line L1, this control voltage is inverted by the inverter INV21 before input to the switch SW11, and then additionally inverted by the inverter INV31 before input to the switch SW21.

Similarly, when the control voltages each at the H level or the L level are input from the control circuit 100 via the control lines L2 to L4, those control voltages are inverted by the inverters INV22 to INV24 before respective input to the switches SW12 to SW14, and then additionally inverted by the inverters INV32 to INV34 before respective input to the switches SW22 to SW24.

Through such digital control, across the first transistor group 221 and the second transistor group 222, the switches SW11 and SW21, the switches SW12 and SW22, the switches SW13 and SW23, and the switches SW14 and SW24 are exclusively controlled in respective pairs. In other words, the first transistor group 221 and the second transistor group 222 are exclusively controlled through the digital control by the control circuit 100.

For example, the control voltages each at the H level are input to the switches SW11 to SW14 so that the switches SW11 to SW14 are turned on. In this state, in the first transistor group 221 on the load 213 side, the input signal voltage from the input terminal (RFIN) is converted to electric current by the NMOS transistors M51 to M54. Thus, the higher gain (high gain) can be obtained.

Next, in order to reduce the high gain (of, for example, 6 dB), the digital control is performed such that the level of the control voltage input from the control circuit 100 to the control line L1 is changed from the L level to the H level, whereby the control voltage at the L level is input to the switch SW11.

Through this digital control, in the first transistor group 221, the control voltages each at the H level are input to the switches SW12 to SW14, but the control voltage at the L level is input to the switch SW11. As a result, the voltage-current conversion, which is performed by the NMOS transistor M51 under the state in which the high gain is obtained, is stopped. With this change of the flow of the electric current to flow into the load 213 side, the gain of, for example, 6 dB can be reduced.

Further, at this time, when the switch SW21 is turned on, the electric current equal to that at the time of the voltage-current conversion by the NMOS transistor M51 flows through the NMOS transistor M61. As a result, variation in total electric current of the circuits can be suppressed.

Next, in order to further reduce the gain (of, for example, 6 dB), the digital control is performed such that the level of the control voltage input to the control line L2 is changed from the L level to the H level, whereby the control voltage at the L level is input to the switch SW12. Through this digital control, not only the voltage-current conversion by the NMOS transistor M51, but also the voltage-current conversion by the NMOS transistor M52 is stopped. With this change of the flow of the electric current to flow into the load 213 side, the gain of, for example, 6 dB can be further reduced. Further, at this time, when the switch SW22 is turned on, the electric current equal to that at the time of the voltage-current conversion by the NMOS transistor M52 flows through the NMOS transistor M62. As a result, variation in total electric current of the circuits can be suppressed.

Similarly, the gain can be further reduced only by changing the levels of the control voltages to be input to the control lines L3 and L4 from the L level to the H level. By changing the levels of the control voltages in this way, the voltage-current conversions by the NMOS transistors M53 and M54 on the load 213 side are stopped. With those changes of the flow of the electric current to flow into the load 213 side, the gain can be further reduced.

In other words, when the control voltages each at the L level are input to the switches SW11 to SW14 on the load 213, the voltage-current conversions by the NMOS transistors M51 to M54 are stopped. With those changes of the flow of the electric current to flow into the load 213 side, the lower gain is obtained. Further, at this time, the NMOS transistors M61 to M64 cause electric current to flow into the power supply line LP side in accordance with the changes of the electric current to flow into the load 213 side. As a result, variation in total electric current of the circuits can be suppressed.

Note that, in order to widen the range between the high gain and the low gain in the above-described configuration in which the four pairs of the NMOS transistors are digitally controlled across the first transistor group 221 and the second transistor group 222 in the variable gain amplifier 200B of FIG. 7, a larger number of pairs of the NMOS transistors may be provided across the first transistor group 221 and the second transistor group 222.

In this way, in the variable gain amplifier 200B of FIG. 7, the first transistor group 221 as a variable voltage-current conversion circuit and the second transistor group 222 as a dummy variable gain amplifier circuit (variable voltage-current conversion circuit) have the same size. A circuit area (cost) substantially doubles in comparison with that in a case where the first transistor group 221 is provided alone. However, through exclusive control on those pairs of the NMOS transistors, arbitrary gain can be obtained.

Specifically, in the above-described variable gain amplifier in related art in which a plurality of shunt unit cells that have the same total size need to be arrayed to obtain arbitrary gain, a trade-off relationship exists between the variable gain range and the circuit area. However, this trade-off between the variable gain range and the circuit area (cost) is overcome although a circuit area substantially doubles due to the provision of the first transistor group 221 and the second transistor group 222 in the variable gain amplifier 200B of FIG. 7. With this, arbitrary gain can be obtained.

Further, in the variable gain amplifier 200B, when gain is varied through the voltage-current conversions by the first transistor group 221, the total electric current of the circuits are varied in conjunction therewith. Thus, a temporal transient response of the variation in gain is delayed, which causes a phenomenon of the deterioration in variable gain linearity in a time direction. As a countermeasure, in the variable gain amplifier 200B, the second transistor group 222 is provided as a dummy variable gain amplifier (Dummy VGA) circuit, and the first transistor group 221 and the second transistor group 222 are exclusively controlled. With this, variation in total electric current is suppressed, whereby the variable gain linearity is improved in the time direction.

Specifically, in the first embodiment described above, the variable gain linearity is deteriorated by the variation of the influence of the parasitic capacitance Cc in accordance with the gain. Meanwhile, in the second embodiment, the gain factor α is correlated with the parasitic capacitance Cc. Thus, the influence of the parasitic capacitance Cc varies in accordance with the gain. As a result, the variable gain linearity is improved.

Specifically, in FIG. 7, in consideration of the parasitic capacitance Cc to be generated between a halfway point between the source of the NMOS transistor M40 and the drain of the NMOS transistor M50 and a halfway point between the input terminal (RFIN) and the gate of the NMOS transistor M54, the electric current id to flow on the drain side of the NMOS transistor M50 is expressed by the following equation (10).

$$id = \left(\alpha Gm + \frac{\alpha Gm}{gm} \cdot \omega Cc\right) Vin \quad (10)$$

Note that, in the equation (10), Gm represents a transconductance of the first transistor group 221, and gm represents a transconductances of the NMOS transistor M40. Further, α represents a gain factor, and ω represents an angular frequency.

Further, Vout can be expressed by the following equation (11) using the equation (10), and hence the gain of the variable gain amplifier 200B of FIG. 7 can be expressed by the following equation (12).

$$Vout = id \times \text{Load} = \left(\alpha Gm + \frac{\alpha Gm}{gm} \cdot \omega Cc\right) Vin \times \text{Load} \qquad (11)$$

$$\text{Gain} = \frac{Vout}{Vin} = \left(\alpha Gm + \frac{\alpha Gm}{gm} \cdot \omega Cc\right) \times \text{Load} \qquad (12)$$

Figure 8:
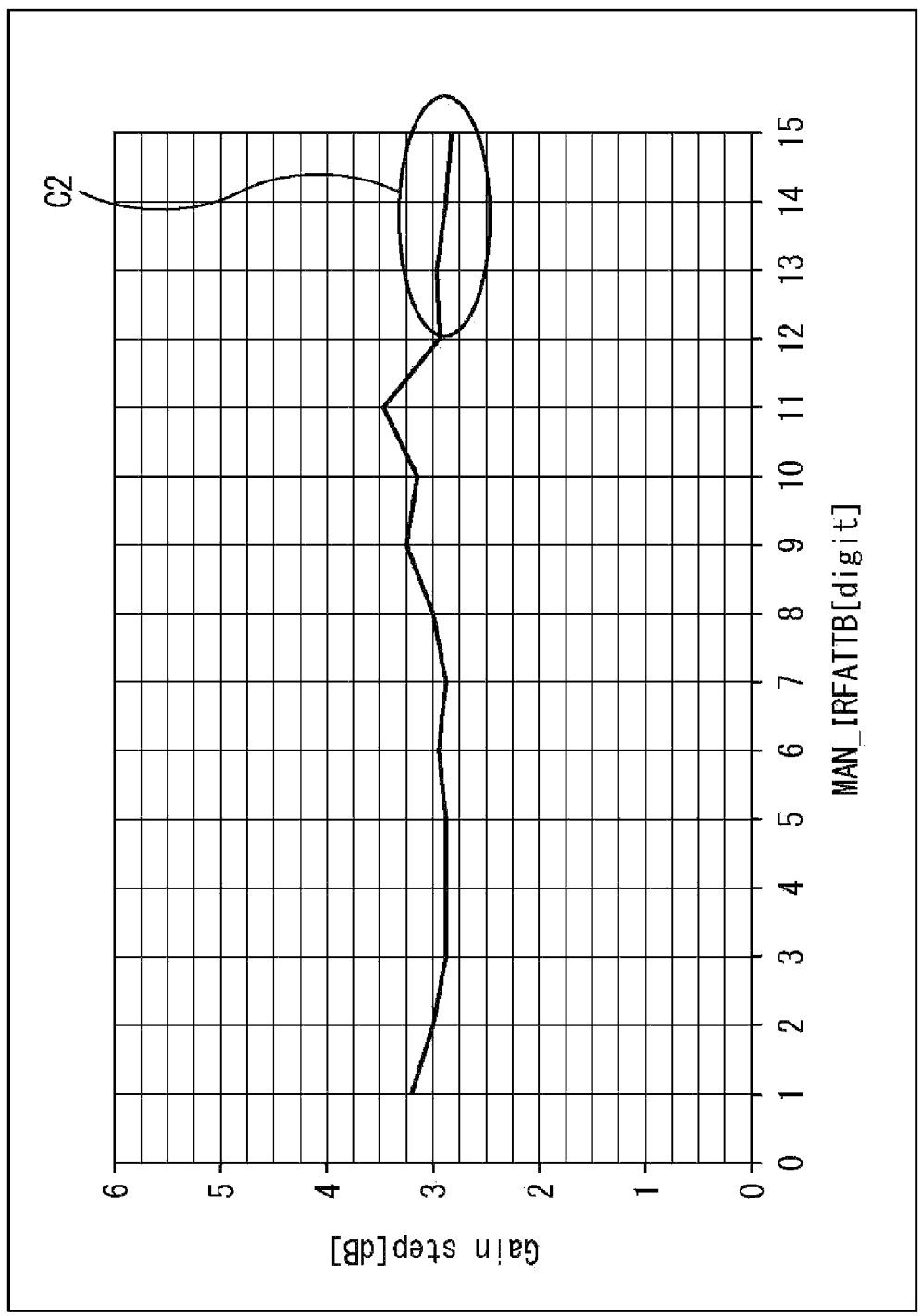
FIG. 8 is a graph showing simulation results using the configuration of the second embodiment.

As is obvious also from the equation (12), the gain factor α and the parasitic capacitance Cc are multiplied by each other, and hence the influence of the parasitic capacitance Cc varies in accordance with the gain. With this, the deterioration in variable gain linearity can be improved. Specifically, as shown in FIG. 8 as simulation results, the deterioration in variable gain linearity is clearly improved in and near a region encircled by C2 in FIG. 8 in comparison with the above-mentioned simulation results in FIG. 6.

As described above, in the second embodiment, the second transistor group 222 as a dummy variable gain amplifier circuit is provided in addition to the first transistor group 221 as a variable voltage-current conversion circuit, and the pairs of the NMOS transistors are exclusively controlled across those transistor groups. As a result, a circuit area substantially doubles in comparison with that in a case where the first transistor group 221 is provided alone. However, the trade-off between the variable gain range and the circuit area (cost) can be overcome, and arbitrary gain can be obtained.

Further, in the second embodiment, when gain is varied through the voltage-current conversions by the first transistor group 221, the total electric current of the circuits are varied in conjunction therewith. Thus, a temporal transient response of the variation in gain is delayed, which causes the phenomenon of the deterioration in variable gain linearity in the time direction. However, the second transistor group 222 is provided as a dummy variable gain amplifier circuit, and the first transistor group 221 and the second transistor group 222 are exclusively controlled. With this, variation in total electric current is suppressed, whereby the variable gain linearity is improved in the time direction.

(4. Third Embodiment)

Incidentally, in order to widen the variable gain range, a larger number of transistors are provided parallel to each other. For example, a transistor size ratio of 1 to 178 is provided for a variable gain range of 45 dB. A total size is determined based on alternating characteristics such as gain and a noise figure (NF), and hence a minimum unit of the NMOS transistor is inevitably markedly reduced. It has been known that variation of the NMOS transistors increases in inverse proportion to the square root of an area, which converges variation precision of the variable gain linearity.

As a countermeasure, in a variable gain amplifier according to a third embodiment, in order to widen the variable gain range and to increase the precision thereof, a configuration corresponding to the first embodiment and a configuration corresponding to the second embodiment are combined with each other. In this variable gain amplifier, in a range in which an attenuation rate is low, the configuration corresponding to the first embodiment (cascode circuit) is activated. Meanwhile, in a range in which the attenuation rate is high, the configuration corresponding to the second embodiment (variable voltage-current conversion circuit) is activated. With this, arbitrary gain is obtained.

Figure 9:
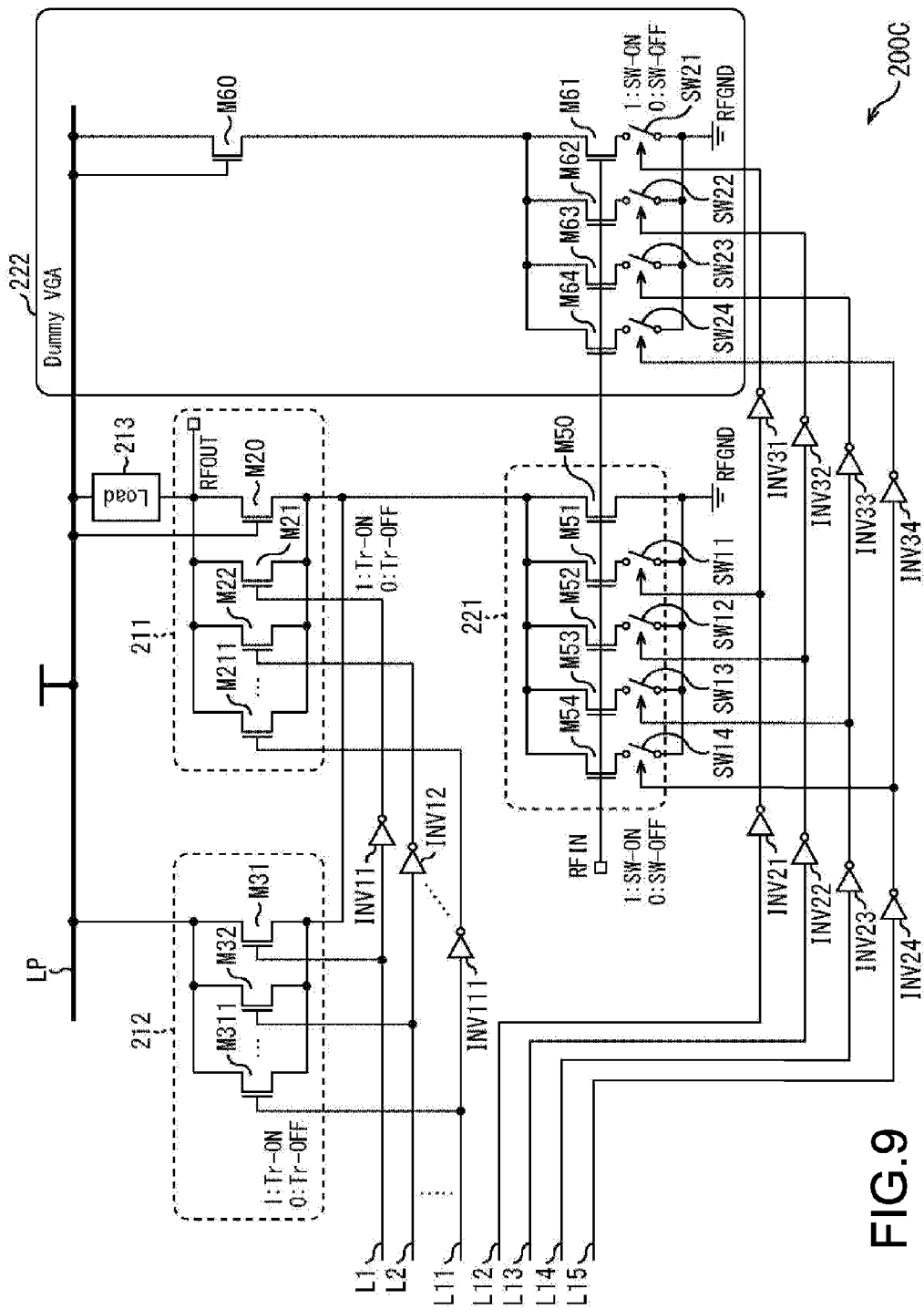
FIG. 9 is a circuit diagram of a configuration of a variable gain amplifier according to a third embodiment of the present technology.

FIG. 9 is a circuit diagram of a configuration of the variable gain amplifier according to the third embodiment of the present technology.

A variable gain amplifier 200C of FIG. 9 is an amplifier configured to switch gain between the input from the input terminal (RFIN) and the output from the output terminal (RFOUT) under the digital control from the control circuit 100 (FIG. 4) so that necessary variable gain ranges are secured.

As shown in FIG. 9, the variable gain amplifier 200C includes the first transistor group 211 and the second transistor group 212 corresponding to the first embodiment, and a third transistor group 221 and a fourth transistor group 222 corresponding to the second embodiment. Note that, in the description of the third embodiment, the first transistor group 221 and the second transistor group 222 of the second embodiment are respectively distinguished from the first transistor group 211 and the second transistor group 212 of the first embodiment by being respectively referred to as the third transistor group 221 and the fourth transistor group 222.

The first transistor group 211 includes NMOS transistors M20 to M211, and the second transistor group 212 includes NMOS transistors M31 to M311. Specifically, the first transistor group 211 and the second transistor group 212 are provided in a pair, and equal to each other in number of the connected NMOS transistors and in size. Note that, the first transistor group 211 and the second transistor group 212 are provided as a cascode circuit.

Specifically, sources of the NMOS transistors M20 to M211 of the first transistor group 211 on the load 213 side are connected to the input terminal (RFIN) through intermediation of the third transistor group 221, and drains thereof are connected to the output terminal (RFOUT). Meanwhile, sources of the NMOS transistors M31 to M311 of the second transistor group 212 are connected to the input terminal (RFIN) through intermediation of the third transistor group 221, and drains thereof are connected to the power supply line LP.

The digital control is performed by inputting the control voltages from the control circuit 100 to the first transistor group 211 and the second transistor group 212 via control lines L1 to L11. With this, variable output signal voltages are output from the first transistor group 211 on the load 213 side to the output terminal (RFOUT).

The third transistor group 221 includes the NMOS transistors M50 to M54, and the fourth transistor group 222 includes the NMOS transistors M60 to M64. Specifically, the third transistor group 221 as a variable voltage-current conversion circuit and the fourth transistor group 222 as a dummy variable gain amplifier circuit (variable voltage-current conversion circuit) have the same.

More specifically, the gates of the NMOS transistors M50 to M54 of the third transistor group 221 on the load 213 side are connected to the input terminal (RFIN), and the drains thereof are connected to the output terminal (RFOUT) through intermediation of the first transistor group 211. Meanwhile, the gates of the NMOS transistors M61 to M64 of the fourth transistor group 222 are connected to the input terminal (RFIN), and the drains thereof are connected to the power supply line LP through intermediation of the NMOS transistor M60.

The digital control is performed by inputting the control voltages from the control circuit 100 to the third transistor group 221 via control lines L12 to L15. With this, the input signal voltage from the input terminal (RFIN) is converted to electric current, and variable output signal voltages are output to the output terminal (RFOUT). Further, exclusive control with respect to the third transistor group 221 is performed by inputting the control voltages from the control circuit 100 to the fourth transistor group 222 via the control lines L12 to L15. With this, variation in total electric current of the circuits can be suppressed at the time when variable gain is obtained through the voltage-current conversions.

Specifically, in the variable gain amplifier 200C of FIG. 9, for example, in the range in which the attenuation rate is low, exclusive control is performed by inputting the control voltages from the control circuit 100 to the first transistor group 211 and the second transistor group 212 via the control lines L1 to L11. With this, arbitrary gain is obtained. Further, for example, in the range in which the attenuation rate is high, exclusive control is performed by inputting the control voltages from the control circuit 100 to the third transistor group 221 and the fourth transistor group 222 via the control lines L12 to L15. Also with this, arbitrary gain is obtained. Specifically, in a case where a gain of from 3 dB to 45 dB is varied in units of 3 dB, within a range of from 3 dB to 33 dB, the first transistor group 211 and the second transistor group 212 are activated in response to the control voltages that are input via the control lines L1 to L11, and within a range of from 33 dB to 45 dB, the third transistor group 221 and the fourth transistor group 222 are activated in response to the control voltages that are input via the control lines L12 to L15.

As described above in the third embodiment, the configuration corresponding to the first embodiment (cascode circuit) and the configuration corresponding to the second embodiment (variable voltage-current conversion circuit) are combined with each other, and the pairs of the NMOS transistors and the pairs of the switches of the corresponding transistor groups are exclusively controlled. As a result, a circuit area increases in comparison with that in a case where the first transistor group 211 or the third transistor group 221 is provided alone. However, the trade-off between the variable gain range and the circuit area (cost) can be overcome. With this, arbitrary gain can be obtained.

Further, in the third embodiment, in the configuration corresponding to the first embodiment, when the attenuation rate increases, the variable gain linearity is deteriorated. As a countermeasure, gain control is performed such that the configuration corresponding to the first embodiment (cascode circuit) is activated first, and then the configuration corresponding to the second embodiment (variable voltage-current conversion circuit) is activated in the range in which the attenuation rate is high. With this, the number of parallel transistors can be reduced to half, and hence the variation precision of the variable gain linearity can be enhanced in principle. As a result, both a wider variable range and higher precision can be obtained.

(5. Modification)

In the description hereinabove, the NMOS transistors are used as transistors of the variable gain amplifiers 200A, 200B, and 200C. However, PMOS transistors may be used instead of the NMOS transistors. In a case where such a configuration is employed, the terminals of the transistors, which are connected to a power source (power supply line LP), are connected to the ground (GND). For example, in a case where PMOS transistors M31 to M34 are used instead of the NMOS transistors M31 to M34 of FIG. 5, which include the drains connected to the power supply line LP, drains of the PMOS transistors M31 to M34 are connected to the ground. Alternatively, instead of those MOS transistors of an N-type or a P-type, a bipolar transistor of an NPN-type or a PNP-type may be employed.

Figure 10:
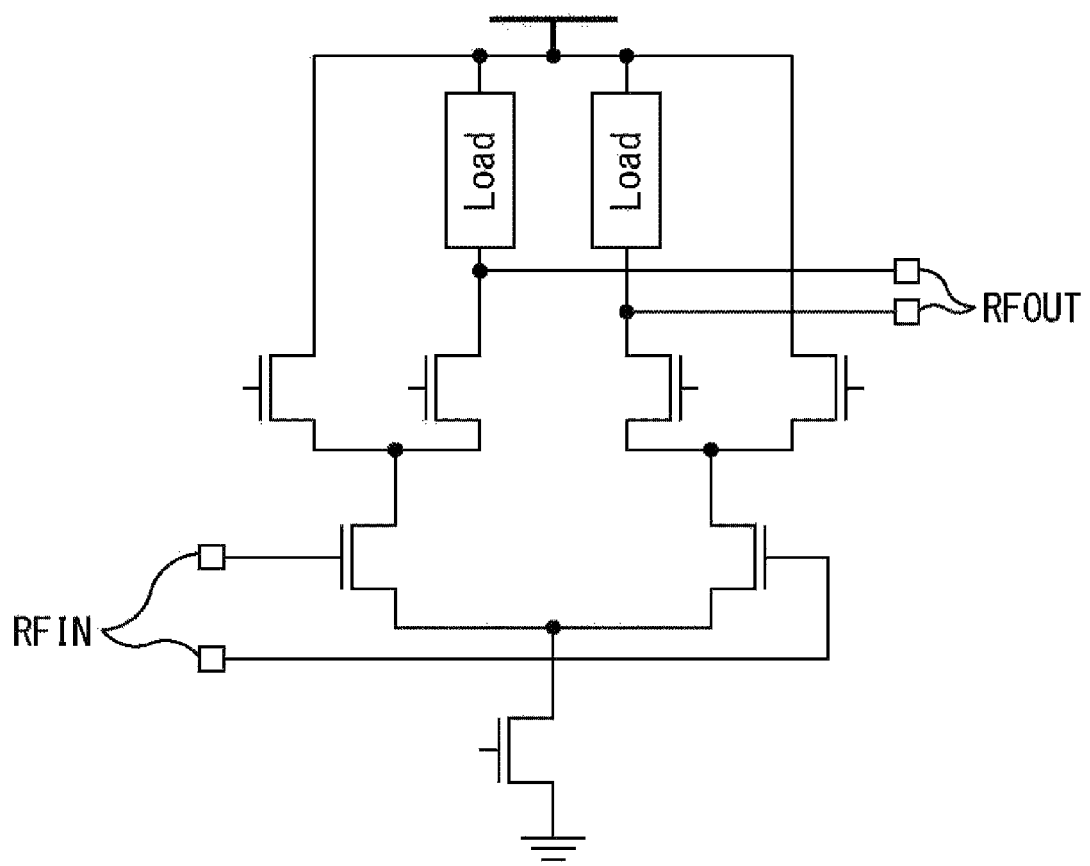
FIG. 10 is a circuit diagram of a configuration example of a differential circuit.

Further, the variable gain amplifiers 200A, 200B, and 200C may each be provided as a differential circuit as shown in FIG. 10. When those amplifiers are provided as the differential circuit, there is an advantage that noise resistance on the power source side can be increased. Alternatively, the variable gain amplifiers 200A, 200B, and 200C may each be provided as an independent circuit, or may be provided as a part of a single electronic circuit. Further, the transistor groups each provided alone in the description hereinabove may each include corresponding two or more transistor groups.

Note that, the embodiments of the present technology are not limited to the embodiments described hereinabove, and various changes may be made thereto without departing from the gist of the present technology.

Note that, the present technology may employ the following configurations.

(1) An amplifier, including a variable shunt circuit including
a first transistor group, and
a second transistor group provided correspondingly to the first transistor group,
the first transistor group including at least one transistor that includes
a first terminal connected directly or indirectly to a voltage-current conversion circuit configured to perform a voltage-current conversion of an input signal,
a second terminal connected directly or indirectly to a load, and
a third terminal connected directly or indirectly to a control circuit,
the second transistor group including at least one transistor that includes
a first terminal connected directly or indirectly to the voltage-current conversion circuit,
a second terminal connected directly or indirectly to one of a power source and a ground, and
a third terminal connected directly or indirectly to the control circuit,
the amplifier being configured to amplify the input signal under exclusive control from the control circuit on a pair of the at least one transistor of the first transistor group and the at least one transistor of the second transistor group.

(2) The amplifier according to Item (1), in which
the at least one transistor of the first transistor group and the at least one transistor of the second transistor group each include a MOS transistor of one of an N-type and a P-type,
the first terminal of the at least one transistor of the first transistor group and the first terminal of the at least one transistor of the second transistor group each include a source,
the second terminal of the at least one transistor of the first transistor group and the second terminal of the at least one transistor of the second transistor group each include a drain, and
the third terminal of the at least one transistor of the first transistor group and the third terminal of the at least one transistor of the second transistor group each include a gate.

(3) The amplifier according to Item (1), in which
the at least one transistor of the first transistor group and the at least one transistor of the second transistor group each include a bipolar transistor of one of an NPN-type and a PNP-type,
the first terminal of the at least one transistor of the first transistor group and the first terminal of the at least one transistor of the second transistor group each include an emitter, the second terminal of the at least one transistor of the first transistor group and the second terminal of the at least one transistor of the second transistor group each include a collector, and the third terminal of the at least one transistor of the first transistor group and the third terminal of the at least one transistor of the second transistor group each include a base.

(4) The amplifier according to any one of Items (1) to (3), in which the amplifier is differentiated.

(5) A driving method for an amplifier, the amplifier including a variable shunt circuit including a first transistor group, and a second transistor group provided correspondingly to the first transistor group, the first transistor group including at least one transistor that includes a first terminal connected directly or indirectly to a voltage-current conversion circuit configured to perform a voltage-current conversion of an input signal, a second terminal connected directly or indirectly to a load, and a third terminal connected directly or indirectly to a control circuit, the second transistor group including at least one transistor that includes a first terminal connected directly or indirectly to the voltage-current conversion circuit, a second terminal connected directly or indirectly to one of a power source and a ground, and a third terminal connected directly or indirectly to the control circuit, the driving method for the amplifier including causing the amplifier to amplify the input signal under exclusive control from the control circuit on a pair of the at least one transistor of the first transistor group and the at least one transistor of the second transistor group.

(6) An amplifier, including a variable voltage-current conversion circuit including a first transistor group configured to perform a voltage-current conversion, and a second transistor group provided correspondingly to the first transistor group and configured to perform a voltage-current conversion, the first transistor group including at least one transistor that includes a first terminal connected directly or indirectly to a first switching element that is controlled by a control circuit, a second terminal connected directly or indirectly to a load, and a third terminal connected directly or indirectly to an input terminal to which an input signal is input, the second transistor group including at least one transistor that includes a first terminal connected directly or indirectly to a second switching element that is controlled by the control circuit, a second terminal connected directly or indirectly to one of a power source and a ground, and a third terminal connected directly or indirectly to the input terminal, the amplifier being configured to amplify the input signal under exclusive control from the control circuit on a pair of the first switching element connected directly or indirectly to the at least one transistor of the first transistor group and the second switching element connected directly or indirectly to the at least one transistor of the second transistor group.

(7) The amplifier according to Item (6), in which the at least one transistor of the first transistor group and the at least one transistor of the second transistor group each include a MOS transistor of one of an N-type and a P-type, the first terminal of the at least one transistor of the first transistor group and the first terminal of the at least one transistor of the second transistor group each include a source, the second terminal of the at least one transistor of the first transistor group and the second terminal of the at least one transistor of the second transistor group each include a drain, and the third terminal of the at least one transistor of the first transistor group and the third terminal of the at least one transistor of the second transistor group each include a gate.

(8) The amplifier according to Item (6), in which the at least one transistor of the first transistor group and the at least one transistor of the second transistor group each include a bipolar transistor of one of an NPN-type and a PNP-type, the first terminal of the at least one transistor of the first transistor group and the first terminal of the at least one transistor of the second transistor group each include an emitter, the second terminal of the at least one transistor of the first transistor group and the second terminal of the at least one transistor of the second transistor group each include a collector, and the third terminal of the at least one transistor of the first transistor group and the third terminal of the at least one transistor of the second transistor group each include a base.

(9) The amplifier according to any one of Items (6) to (8), in which the amplifier is differentiated.

(10) A driving method for an amplifier, the amplifier including a variable voltage-current conversion circuit including a first transistor group configured to perform a voltage-current conversion, and a second transistor group provided correspondingly to the first transistor group and configured to perform a voltage-current conversion, the first transistor group including at least one transistor that includes a first terminal connected directly or indirectly to a first switching element that is controlled by a control circuit, a second terminal connected directly or indirectly to a load, and a third terminal connected directly or indirectly to an input terminal to which an input signal is input, the second transistor group including at least one transistor that includes a first terminal connected directly or indirectly to a second switching element that is controlled by the control circuit, a second terminal connected directly or indirectly to one of a power source and a ground, and a third terminal connected directly or indirectly to the input terminal, the driving method for the amplifier including causing the amplifier to amplify the input signal under exclusive control from the control circuit on a pair of the first switching element connected directly or indirectly to the at least one transistor of the first transistor group and the second switching element connected directly or indirectly to the at least one transistor of the second transistor group.

(11) An amplifier, including:
a cascode circuit including
a first transistor group, and
a second transistor group provided correspondingly to the first transistor group,
the first transistor group including at least one transistor that includes
a first terminal connected directly or indirectly to a voltage-current conversion circuit configured to perform a voltage-current conversion of an input signal,
a second terminal connected directly or indirectly to a load, and
a third terminal connected directly or indirectly to a control circuit,
the second transistor group including at least one transistor that includes
a first terminal connected directly or indirectly to the voltage-current conversion circuit,
a second terminal connected directly or indirectly to one of a power source and a ground, and
a third terminal connected directly or indirectly to the control circuit; and
a variable voltage-current conversion circuit including
a third transistor group configured to serve as the voltage-current conversion circuit and to perform the voltage-current conversion, and
a fourth transistor group provided correspondingly to the third transistor group and configured to perform a voltage-current conversion,
the third transistor group including at least one transistor that includes
a first terminal connected directly or indirectly to a first switching element that is controlled by the control circuit,
a second terminal connected directly or indirectly to the load, and
a third terminal connected directly or indirectly to an input terminal to which the input signal is input,
the fourth transistor group including at least one transistor that includes
a first terminal connected directly or indirectly to a second switching element that is controlled by the control circuit,
a second terminal connected directly or indirectly to one of the power source and the ground, and
a third terminal connected directly or indirectly to the input terminal,
the amplifier being configured to amplify the input signal under exclusive control from the control circuit on a pair of the at least one transistor of the first transistor group and the at least one transistor of the second transistor group,
the amplifier being configured to amplify the input signal under exclusive control from the control circuit on a pair of the first switching element connected directly or indirectly to the at least one transistor of the third transistor group and the second switching element connected directly or indirectly to the at least one transistor of the fourth transistor group.

(12) The amplifier according to Item (11), in which
the at least one transistor of the first transistor group, the at least one transistor of the second transistor group, the at least one transistor of the third transistor group, and the at least one transistor of the fourth transistor group each include a MOS transistor of one of an N-type and a P-type,
the first terminal of the at least one transistor of the first transistor group, the first terminal of the at least one transistor of the second transistor group, the first terminal of the at least one transistor of the third transistor group, and the first terminal of the at least one transistor of the fourth transistor group each include a source,
the second terminal of the at least one transistor of the first transistor group, the second terminal of the at least one transistor of the second transistor group, the second terminal of the at least one transistor of the third transistor group, and the second terminal of the at least one transistor of the fourth transistor group each include a drain, and
the third terminal of the at least one transistor of the first transistor group, the third terminal of the at least one transistor of the second transistor group, the third terminal of the at least one transistor of the third transistor group, and the third terminal of the at least one transistor of the fourth transistor group each include a gate.

(13) The amplifier according to Item (11), in which
the at least one transistor of the first transistor group, the at least one transistor of the second transistor group, the at least one transistor of the third transistor group, and the at least one transistor of the fourth transistor group each include a bipolar transistor of one of an NPN-type and a PNP-type,
the first terminal of the at least one transistor of the first transistor group, the first terminal of the at least one transistor of the second transistor group, the first terminal of the at least one transistor of the third transistor group, and the first terminal of the at least one transistor of the fourth transistor group each include an emitter,
the second terminal of the at least one transistor of the first transistor group, the second terminal of the at least one transistor of the second transistor group, the second terminal of the at least one transistor of the third transistor group, and the second terminal of the at least one transistor of the fourth transistor group each include a collector, and
the third terminal of the at least one transistor of the first transistor group, the third terminal of the at least one transistor of the second transistor group, the third terminal of the at least one transistor of the third transistor group, and the third terminal of the at least one transistor of the fourth transistor group each include a base.

(14) The amplifier according to any one of Items (11) to (13), in which the amplifier is differentiated.

(15) A driving method for an amplifier, the amplifier including:
a cascode circuit including
a first transistor group, and
a second transistor group provided correspondingly to the first transistor group,
the first transistor group including at least one transistor that includes
a first terminal connected directly or indirectly to a voltage-current conversion circuit configured to perform a voltage-current conversion of an input signal,
a second terminal connected directly or indirectly to a load, and
a third terminal connected directly or indirectly to a control circuit,
the second transistor group including at least one transistor that includes
a first terminal connected directly or indirectly to the voltage-current conversion circuit,
a second terminal connected directly or indirectly to one of a power source and a ground, and
a third terminal connected directly or indirectly to the control circuit; and a variable voltage-current conversion circuit including
a third transistor group configured to serve as the voltage-current conversion circuit and to perform the voltage-current conversion, and
a fourth transistor group provided correspondingly to the third transistor group and configured to perform a voltage-current conversion,
the third transistor group including at least one transistor that includes
a first terminal connected directly or indirectly to a first switching element that is controlled by the control circuit,
a second terminal connected directly or indirectly to the load, and
a third terminal connected directly or indirectly to an input terminal to which the input signal is input,
the fourth transistor group including at least one transistor that includes
a first terminal connected directly or indirectly to a second switching element that is controlled by the control circuit,
a second terminal connected directly or indirectly to one of the power source and the ground, and
a third terminal connected directly or indirectly to the input terminal,
the driving method for the amplifier including:
causing the amplifier to amplify the input signal under exclusive control from the control circuit on a pair of the at least one transistor of the first transistor group and the at least one transistor of the second transistor group; and
causing the amplifier to amplify the input signal under exclusive control from the control circuit on a pair of the first switching element connected directly or indirectly to the at least one transistor of the third transistor group and the second switching element connected directly or indirectly to the at least one transistor of the fourth transistor group.

(16) An electronic circuit system, including:
an amplifier; and
a control circuit configured to control operations of the amplifier,
the amplifier including a variable shunt circuit including
a first transistor group, and
a second transistor group provided correspondingly to the first transistor group,
the first transistor group including at least one transistor that includes
a first terminal connected directly or indirectly to a voltage-current conversion circuit configured to perform a voltage-current conversion of an input signal,
a second terminal connected directly or indirectly to a load, and
a third terminal connected directly or indirectly to the control circuit,
the second transistor group including at least one transistor that includes
a first terminal connected directly or indirectly to the voltage-current conversion circuit,
a second terminal connected directly or indirectly to one of a power source and a ground, and
a third terminal connected directly or indirectly to the control circuit,
the control circuit being configured to perform exclusive control on a pair of the at least one transistor of the first transistor group and the at least one transistor of the second transistor group.

(17) An electronic circuit system, including:
an amplifier; and
a control circuit configured to control operations of the amplifier,
the amplifier including a variable voltage-current conversion circuit including
a first transistor group configured to perform a voltage-current conversion, and
a second transistor group provided correspondingly to the first transistor group and configured to perform a voltage-current conversion,
the first transistor group including at least one transistor that includes
a first terminal connected directly or indirectly to a first switching element that is controlled by the control circuit,
a second terminal connected directly or indirectly to a load, and
a third terminal connected directly or indirectly to an input terminal to which an input signal is input,
the second transistor group including at least one transistor that includes
a first terminal connected directly or indirectly to a second switching element that is controlled by the control circuit,
a second terminal connected directly or indirectly to one of a power source and a ground, and
a third terminal connected directly or indirectly to the input terminal,
the control circuit being configured to perform exclusive control on a pair of the first switching element connected directly or indirectly to the at least one transistor of the first transistor group and the second switching element connected directly or indirectly to the at least one transistor of the second transistor group.

(18) An electronic circuit system, including:
an amplifier; and
a control circuit configured to control operations of the amplifier,
the amplifier including
a cascode circuit including
a first transistor group, and
a second transistor group provided correspondingly to the first transistor group,
the first transistor group including at least one transistor that includes
a first terminal connected directly or indirectly to a voltage-current conversion circuit configured to perform a voltage-current conversion of an input signal,
a second terminal connected directly or indirectly to a load, and
a third terminal connected directly or indirectly to the control circuit,
the second transistor group including at least one transistor that includes
a first terminal connected directly or indirectly to the voltage-current conversion circuit,
a second terminal connected directly or indirectly to one of a power source and a ground, and
a third terminal connected directly or indirectly to the control circuit; and
a variable voltage-current conversion circuit including
a third transistor group configured to serve as the voltage-current conversion circuit and to perform the voltage-current conversion, and a fourth transistor group provided correspondingly to the third transistor group and configured to perform a voltage-current conversion, the third transistor group including at least one transistor that includes
  a first terminal connected directly or indirectly to a first switching element that is controlled by the control circuit,
  a second terminal connected directly or indirectly to the load, and
  a third terminal connected directly or indirectly to an input terminal to which the input signal is input, the fourth transistor group including at least one transistor that includes
  a first terminal connected directly or indirectly to a second switching element that is controlled by the control circuit,
  a second terminal connected directly or indirectly to one of the power source and the ground, and
  a third terminal connected directly or indirectly to the input terminal, the control circuit being configured to perform exclusive control on a pair of the at least one transistor of the first transistor group and the at least one transistor of the second transistor group, the control circuit being configured to perform exclusive control on a pair of the first switching element connected directly or indirectly to the at least one transistor of the third transistor group and the second switching element connected directly or indirectly to the at least one transistor of the fourth transistor group.

It should be understood by those skilled in the art that various modifications, combinations, sub-combinations and alterations may occur depending on design requirements and other factors insofar as they are within the scope of the appended claims or the equivalents thereof.

What is claimed is:

1. An amplifier, comprising a variable shunt circuit including
  a first transistor group, and
  a second transistor group provided correspondingly to the first transistor group,
  the first transistor group including at least one transistor that includes
    a first terminal connected directly or indirectly to a voltage-current conversion circuit configured to perform a voltage-current conversion of an input signal,
    a second terminal connected directly or indirectly to a load, and
    a third terminal connected directly or indirectly to a control circuit,
  the second transistor group including at least one transistor that includes
    a first terminal connected directly to the voltage-current conversion circuit,
    a second terminal connected directly or indirectly to one of a power source and a ground, and
    a third terminal connected directly or indirectly to the control circuit,
  the amplifier being configured to amplify the input signal under exclusive control from the control circuit on a pair of the at least one transistor of the first transistor group and the at least one transistor of the second transistor group.

2. An amplifier, comprising a variable shunt circuit including
  a first transistor group, and
  a second transistor group provided correspondingly to the first transistor group,
  the first transistor group including at least one transistor that includes
    a first terminal connected directly or indirectly to a voltage-current conversion circuit configured to perform a voltage-current conversion of an input signal,
    a second terminal connected directly or indirectly to a load, and
    a third terminal connected directly or indirectly to a control circuit,
  the second transistor group including at least one transistor that includes
    a first terminal connected directly to the voltage-current conversion circuit,
    a second terminal connected directly or indirectly to one of a power source and a ground, and
    a third terminal connected directly or indirectly to the control circuit,
  the at least one transistor of the first transistor group and the at least one transistor of the second transistor group each include a MOS transistor of one of an N-type and a P-type,
  the first terminal of the at least one transistor of the first transistor group and the first terminal of the at least one transistor of the second transistor group each include a source,
  the second terminal of the at least one transistor of the first transistor group and the second terminal of the at least one transistor of the second transistor group each include a drain,
  the third terminal of the at least one transistor of the first transistor group and the third terminal of the at least one transistor of the second transistor group each include a gate, and
  the amplifier being configured to amplify the input signal under exclusive control from the control circuit on a pair of the at least one transistor of the first transistor group and the at least one transistor of the second transistor group.

3. An amplifier, comprising variable shunt circuit including
  a first transistor group, and
  a second transistor group provided correspondingly to the first transistor group,
  the first transistor group including at least one transistor that includes
    a first terminal connected directly or indirectly to a voltage-current conversion circuit configured to perform a voltage-current conversion of an input signal,
    a second terminal connected directly or indirectly to a load, and
    a third terminal connected directly or indirectly to a control circuit,
  the second transistor group including at least one transistor that includes
    a first terminal connected directly to the voltage-current conversion circuit,
    a second terminal connected directly or indirectly to one of a power source and a ground, and
    a third terminal connected directly or indirectly to the control circuit, the at least one transistor of the first transistor group and the at least one transistor of the second transistor group each include a bipolar transistor of one of an NPN-type and a PNP-type, the first terminal of the at least one transistor of the first transistor group and the first terminal of the at least one transistor of the second transistor group each include an emitter, the second terminal of the at least one transistor of the first transistor group and the second terminal of the at least one transistor of the second transistor group each include a collector, and the third terminal of the at least one transistor of the first transistor group and the third terminal of the at least one transistor of the second transistor group each include a base, and the amplifier being configured to amplify the input signal under exclusive control from the control circuit on a pair of the at least one transistor of the first transistor group and the at least one transistor of the second transistor group.

4. The amplifier according to claim 1, wherein the amplifier is differentiated.

5. A driving method for an amplifier, the amplifier including a variable shunt circuit including
   a first transistor group, and
   a second transistor group provided correspondingly to the first transistor group,
   the first transistor group including at least one transistor that includes
      a first terminal connected directly or indirectly to a voltage-current conversion circuit configured to perform a voltage-current conversion of an input signal,
      a second terminal connected directly or indirectly to a load, and
      a third terminal connected directly or indirectly to a control circuit,
   the second transistor group including at least one transistor that includes
      a first terminal connected directly to the voltage-current conversion circuit,
      a second terminal connected directly or indirectly to one of a power source and a ground, and
      a third terminal connected directly or indirectly to the control circuit,
   the driving method for the amplifier comprising:
   causing the amplifier to amplify the input signal under exclusive control from the control circuit on a pair of the at least one transistor of the first transistor group and the at least one transistor of the second transistor group.

6. An amplifier, comprising a variable voltage-current conversion circuit including
   a first transistor group configured to perform a voltage-current conversion, and
   a second transistor group provided correspondingly to the first transistor group and configured to perform a voltage-current conversion,
   the first transistor group including at least one transistor that includes
      a first terminal connected directly or indirectly to a first switching element that is controlled by a control circuit,
      a second terminal connected directly or indirectly to a load, and
      a third terminal connected directly or indirectly to an input terminal to which an input signal is input,
   the second transistor group including at least one transistor that includes
      a first terminal connected directly to a second switching element that is controlled by the control circuit,
      a second terminal connected directly or indirectly to one of a power source and a ground, and
      a third terminal connected directly or indirectly to the input terminal,
   wherein the at least one transistor of the first transistor group and the at least one transistor of the second transistor group each include a MOS transistor of one of an N-type and a P-type, the first terminal of the at least one transistor of the first transistor group and the first terminal of the at least one transistor of the second transistor group each include a source, the second terminal of the at least one transistor of the first transistor group and the second terminal of the at least one transistor of the second transistor group each include a drain, the third terminal of the at least one transistor of the first transistor group and the third terminal of the at least one transistor of the second transistor group each include a gate, and the amplifier being configured to amplify the input signal under exclusive control from the control circuit on a pair of the first switching element connected directly or indirectly to the at least one transistor of the first transistor group and the second switching element connected directly or indirectly to the at least one transistor of the second transistor group.

7. An amplifier, comprising a variable voltage-current conversion circuit including
   a first transistor group configured to perform a voltage-current conversion, and
   a second transistor group provided correspondingly to the first transistor group and configured to perform a voltage-current conversion,
   the first transistor group including at least one transistor that includes
      a first terminal connected directly or indirectly to a first switching element that is controlled by a control circuit,
      a second terminal connected directly or indirectly to a load, and
      a third terminal connected directly or indirectly to an input terminal to which an input signal is input,
   the second transistor group including at least one transistor that includes
      a first terminal connected directly to a second switching element that is controlled by the control circuit,
      a second terminal connected directly or indirectly to one of a power source and a ground, and
      a third terminal connected directly or indirectly to the input terminal,
   wherein the at least one transistor of the first transistor group and the at least one transistor of the second transistor group each include a bipolar transistor of one of an NPN-type and a PNP-type, the first terminal of the at least one transistor of the first transistor group and the first terminal of the at least one transistor of the second transistor group each include an emitter, the second terminal of the at least one transistor of the first transistor group and the second terminal of the at least one transistor of the second transistor group each include a collector, the third terminal of the at least one transistor of the first transistor group and the third terminal of the at least one transistor of the second transistor group each include a base, and the amplifier being configured to amplify the input signal under exclusive control from the control circuit on a pair of the first switching element connected directly or indirectly to the at least one transistor of the first transistor group and the second switching element connected directly or indirectly to the at least one transistor of the second transistor group.

8. The amplifier according to claim 6, wherein the amplifier is differentiated.

9. A driving method for an amplifier, the amplifier including a variable voltage-current conversion circuit including
a first transistor group configured to perform a voltage-current conversion, and
a second transistor group provided correspondingly to the first transistor group and configured to perform a voltage-current conversion,
the first transistor group including at least one transistor that includes
a first terminal connected directly or indirectly to a first switching element that is controlled by a control circuit,
a second terminal connected directly or indirectly to a load, and
a third terminal connected directly or indirectly to an input terminal to which an input signal is input,
the second transistor group including at least one transistor that includes
a first terminal connected directly to a second switching element that is controlled by the control circuit,
a second terminal connected directly or indirectly to one of a power source and a ground, and
a third terminal connected directly or indirectly to the input terminal,
wherein the at least one transistor of the first transistor group and the at least one transistor of the second transistor group each include a MOS transistor of one of an N-type and a P-type,
the first terminal of the at least one transistor of the first transistor group and the first terminal of the at least one transistor of the second transistor group each include a source,
the second terminal of the at least one transistor of the first transistor group and the second terminal of the at least one transistor of the second transistor group each include a drain,
the third terminal of the at least one transistor of the first transistor group and the third terminal of the at least one transistor of the second transistor group each include a gate, and
the driving method for the amplifier comprising:
causing the amplifier to amplify the input signal under exclusive control from the control circuit on a pair of the first switching element connected directly or indirectly to the at least one transistor of the first transistor group and the second switching element connected directly or indirectly to the at least one transistor of the second transistor group.

10. An amplifier, comprising:
a cascode circuit including
a first transistor group, and
a second transistor group provided correspondingly to the first transistor group,
the first transistor group including at least one transistor that includes
a first terminal connected directly or indirectly to a voltage-current conversion circuit configured to perform a voltage-current conversion of an input signal,
a second terminal connected directly or indirectly to a load, and
a third terminal connected directly or indirectly to a control circuit,
the second transistor group including at least one transistor that includes
a first terminal connected directly or indirectly to the voltage-current conversion circuit,
a second terminal connected directly or indirectly to one of a power source and a ground, and
a third terminal connected directly or indirectly to the control circuit; and
a variable voltage-current conversion circuit including
a third transistor group configured to serve as the voltage-current conversion circuit and to perform the voltage-current conversion, and
a fourth transistor group provided correspondingly to the third transistor group and configured to perform a voltage-current conversion,
the third transistor group including at least one transistor that includes
a first terminal connected directly or indirectly to a first switching element that is controlled by the control circuit,
a second terminal connected directly or indirectly to the load, and
a third terminal connected directly or indirectly to an input terminal to which the input signal is input,
the fourth transistor group including at least one transistor that includes
a first terminal connected directly or indirectly to a second switching element that is controlled by the control circuit,
a second terminal connected directly or indirectly to one of the power source and the ground, and
a third terminal connected directly or indirectly to the input terminal,
the amplifier being configured to amplify the input signal under exclusive control from the control circuit on a pair of the at least one transistor of the first transistor group and the at least one transistor of the second transistor group,
the amplifier being configured to amplify the input signal under exclusive control from the control circuit on a pair of the first switching element connected directly or indirectly to the at least one transistor of the third transistor group and the second switching element connected directly or indirectly to the at least one transistor of the fourth transistor group.

11. The amplifier according to claim 10, wherein
the at least one transistor of the first transistor group, the at least one transistor of the second transistor group, the at least one transistor of the third transistor group, and the at least one transistor of the fourth transistor group each include a MOS transistor of one of an N-type and a P-type,
the first terminal of the at least one transistor of the first transistor group, the first terminal of the at least one transistor of the second transistor group, the first terminal of the at least one transistor of the third transistor group, and the first terminal of the at least one transistor of the fourth transistor group each include a source, the second terminal of the at least one transistor of the first transistor group, the second terminal of the at least one transistor of the second transistor group, the second terminal of the at least one transistor of the third transistor group, and the second terminal of the at least one transistor of the fourth transistor group each include a drain, and the third terminal of the at least one transistor of the first transistor group, the third terminal of the at least one transistor of the second transistor group, the third terminal of the at least one transistor of the third transistor group, and the third terminal of the at least one transistor of the fourth transistor group each include a gate.

12. The amplifier according to claim 10, wherein the at least one transistor of the first transistor group, the at least one transistor of the second transistor group, the at least one transistor of the third transistor group, and the at least one transistor of the fourth transistor group each include a bipolar transistor of one of an NPN-type and a PNP-type, the first terminal of the at least one transistor of the first transistor group, the first terminal of the at least one transistor of the second transistor group, the first terminal of the at least one transistor of the third transistor group, and the first terminal of the at least one transistor of the fourth transistor group each include an emitter, the second terminal of the at least one transistor of the first transistor group, the second terminal of the at least one transistor of the second transistor group, the second terminal of the at least one transistor of the third transistor group, and the second terminal of the at least one transistor of the fourth transistor group each include a collector, and the third terminal of the at least one transistor of the first transistor group, the third terminal of the at least one transistor of the second transistor group, the third terminal of the at least one transistor of the third transistor group, and the third terminal of the at least one transistor of the fourth transistor group each include a base.

13. The amplifier according to claim 10, wherein the amplifier is differentiated.

14. A driving method for an amplifier, the amplifier including:
  a cascode circuit including
    a first transistor group, and
    a second transistor group provided correspondingly to the first transistor group,
    the first transistor group including at least one transistor that includes
      a first terminal connected directly or indirectly to a voltage-current conversion circuit configured to perform a voltage-current conversion of an input signal,
      a second terminal connected directly or indirectly to a load, and
      a third terminal connected directly or indirectly to a control circuit,
    the second transistor group including at least one transistor that includes
      a first terminal connected directly or indirectly to the voltage-current conversion circuit,
      a second terminal connected directly or indirectly to one of a power source and a ground, and
      a third terminal connected directly or indirectly to the control circuit; and
  a variable voltage-current conversion circuit including
    a third transistor group configured to serve as the voltage-current conversion circuit and to perform the voltage-current conversion, and
    a fourth transistor group provided correspondingly to the third transistor group and configured to perform a voltage-current conversion,
    the third transistor group including at least one transistor that includes
      a first terminal connected directly or indirectly to a first switching element that is controlled by the control circuit,
      a second terminal connected directly or indirectly to the load, and
      a third terminal connected directly or indirectly to an input terminal to which the input signal is input,
    the fourth transistor group including at least one transistor that includes
      a first terminal connected directly or indirectly to a second switching element that is controlled by the control circuit,
      a second terminal connected directly or indirectly to one of the power source and the ground, and
      a third terminal connected directly or indirectly to the input terminal,
  the driving method for the amplifier comprising:
    causing the amplifier to amplify the input signal under exclusive control from the control circuit on a pair of the at least one transistor of the first transistor group and the at least one transistor of the second transistor group; and
    causing the amplifier to amplify the input signal under exclusive control from the control circuit on a pair of the first switching element connected directly or indirectly to the at least one transistor of the third transistor group and the second switching element connected directly or indirectly to the at least one transistor of the fourth transistor group.

15. An electronic circuit system, comprising:
  an amplifier; and
  a control circuit configured to control operations of the amplifier,
  the amplifier including a variable shunt circuit including
    a first transistor group, and
    a second transistor group provided correspondingly to the first transistor group,
    the first transistor group including at least one transistor that includes
      a first terminal connected directly or indirectly to a voltage-current conversion circuit configured to perform a voltage-current conversion of an input signal,
      a second terminal connected directly or indirectly to a load, and
      a third terminal connected directly or indirectly to the control circuit,
    the second transistor group including at least one transistor that includes
      a first terminal connected directly to the voltage-current conversion circuit,
      a second terminal connected directly or indirectly to one of a power source and a ground, and
      a third terminal connected directly or indirectly to the control circuit, the control circuit being configured to perform exclusive control on a pair of the at least one transistor of the first transistor group and the at least one transistor of the second transistor group.

16. An electronic circuit system, comprising:
an amplifier; and
a control circuit configured to control operations of the amplifier,
the amplifier including a variable voltage-current conversion circuit including
  a first transistor group configured to perform a voltage-current conversion, and
  a second transistor group provided correspondingly to the first transistor group and configured to perform a voltage-current conversion,
  the first transistor group including at least one transistor that includes
    a first terminal connected directly or indirectly to a first switching element that is controlled by the control circuit,
    a second terminal connected directly or indirectly to a load, and
    a third terminal connected directly or indirectly to an input terminal to which an input signal is input,
  the second transistor group including at least one transistor that includes
    a first terminal connected directly to a second switching element that is controlled by the control circuit,
    a second terminal connected directly or indirectly to one of a power source and a ground, and
    a third terminal connected directly or indirectly to the input terminal,
the at least one transistor of the first transistor group and the at least one transistor of the second transistor group each include a MOS transistor of one of an N-type and a P-type,
the first terminal of the at least one transistor of the first transistor group and the first terminal of the at least one transistor of the second transistor group each include a source,
the second terminal of the at least one transistor of the first transistor group and the second terminal of the at least one transistor of the second transistor group each include a drain,
the third terminal of the at least one transistor of the first transistor group and the third terminal of the at least one transistor of the second transistor group each include a gate, and
the control circuit being configured to perform exclusive control on a pair of the first switching element connected directly or indirectly to the at least one transistor of the first transistor group and the second switching element connected directly or indirectly to the at least one transistor of the second transistor group.

17. An electronic circuit system, comprising:
an amplifier; and
a control circuit configured to control operations of the amplifier,
the amplifier including
  a cascode circuit including
    a first transistor group, and
    a second transistor group provided correspondingly to the first transistor group,
    the first transistor group including at least one transistor that includes
      a first terminal connected directly or indirectly to a voltage-current conversion circuit configured to perform a voltage-current conversion of an input signal,
      a second terminal connected directly or indirectly to a load, and
      a third terminal connected directly or indirectly to the control circuit,
    the second transistor group including at least one transistor that includes
      a first terminal connected directly or indirectly to the voltage-current conversion circuit,
      a second terminal connected directly or indirectly to one of a power source and a ground, and
      a third terminal connected directly or indirectly to the control circuit; and
  a variable voltage-current conversion circuit including
    a third transistor group configured to serve as the voltage-current conversion circuit and to perform the voltage-current conversion, and
    a fourth transistor group provided correspondingly to the third transistor group and configured to perform a voltage-current conversion,
    the third transistor group including at least one transistor that includes
      a first terminal connected directly or indirectly to a first switching element that is controlled by the control circuit,
      a second terminal connected directly or indirectly to the load, and
      a third terminal connected directly or indirectly to an input terminal to which the input signal is input,
    the fourth transistor group including at least one transistor that includes
      a first terminal connected directly or indirectly to a second switching element that is controlled by the control circuit,
      a second terminal connected directly or indirectly to one of the power source and the ground, and
      a third terminal connected directly or indirectly to the input terminal,
the control circuit being configured to perform exclusive control on a pair of the at least one transistor of the first transistor group and the at least one transistor of the second transistor group,
the control circuit being configured to perform exclusive control on a pair of the first switching element connected directly or indirectly to the at least one transistor of the third transistor group and the second switching element connected directly or indirectly to the at least one transistor of the fourth transistor group.

* * * * *